(12) United States Patent
Shibuya

(10) Patent No.: US 7,449,282 B2
(45) Date of Patent: Nov. 11, 2008

(54) LITHOGRAPHIC PRINTING PLATE PRECURSOR

(75) Inventor: Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/116,399

(22) Filed: Apr. 28, 2005

(65) Prior Publication Data

US 2005/0255404 A1 Nov. 17, 2005

(30) Foreign Application Priority Data

Apr. 30, 2004 (JP) .......................... P.2004-136036

(51) Int. Cl.
*G03F 7/00* (2006.01)
*G03F 7/004* (2006.01)

(52) U.S. Cl. ................. 430/302; 430/270.1; 430/281.1; 430/933

(58) Field of Classification Search .............. 430/270.1, 430/281.1, 302, 933
See application file for complete search history.

(56) References Cited

U.S. PATENT DOCUMENTS 4,778,623 A * 10/1988 Guglielmetti .......... 252/301.21
5,001,253 A * 3/1991 Guglielmetti ................ 558/415
6,475,700 B1 * 11/2002 Higashi et al. ........... 430/278.1
6,638,687 B2 * 10/2003 Higashi et al. .............. 430/302
6,727,044 B1 * 4/2004 Fujimaki et al. ......... 430/284.1

FOREIGN PATENT DOCUMENTS

| EP | 982629 A1 * | 3/2000 |
|---|---|---|
| JP | 3-287165 A | 12/1991 |
| JP | 2000-258910 A | 9/2000 |

* cited by examiner

Primary Examiner—Amanda C. Walke
(74) Attorney, Agent, or Firm—Sughrue Mion, PLLC

(57) ABSTRACT

A lithographic printing plate precursor comprising a photosensitive layer comprising: (A) a fluorescent brightening agent; (B) an activator compound being capable of inducing a chemical change by an interaction with light absorption of the fluorescent brightening agent to produce at least one of a radical, an acid and a base; (C) a compound being capable of undergoing a reaction by an effect of at least one of a radical, an acid and a base to irreversibly change in its physical or chemical properties; and (D) a polyurethane resin binder, wherein the polyurethane resin binder is synthesized from at least following compounds (i), (ii), (iii) and (iv): (i) a diisocyanate compound; (ii) a diol compound having at least one carboxyl group; (iii) a diol compound having a logP value of less than 0; and (iv) a diol compound having a logP value of 0 or more, with the proviso that each of the diol compound (iii) and the diol compound (iv) does not have a carboxyl group.

15 Claims, No Drawings

US 7,449,282 B2

LITHOGRAPHIC PRINTING PLATE PRECURSOR

FIELD OF THE INVENTION

The present invention relates to a fluorescent brightening agent and a photoinitiation system using the same. More specifically, the present invention relates to a lithographic printing plate precursor having a photosensitive layer comprising a photoinitiation system with high sensitivity and excellent stability. Also, the present invention relates to a lithographic printing plate precursor capable of producing a printing plate by scan exposure based on digital signals.

BACKGROUND OF THE INVENTION

Conventionally, a PS plate comprising a hydrophilic support having provided thereon a lipophilic photosensitive resin layer has been widely used as a lithographic printing plate. According to the usual production method therefor, a plate is subjected to mask exposure (plane exposure) through a lith film and then the non-image area is dissolved and removed to obtain a desired printing plate.

In recent years, digitization technology of electronically processing, storing and outputting image information using a computer has been widespread and various new methods for outputting an image, which can cope with this technology, have been used in practice. This tendency has brought about the demand for a computer-to-plate (CTP) technique of requiring no lith film but directly producing a printing plate by scanning highly directive light such as laser light according to digitized image information. As a result, it has become an important technical concern to obtain a printing plate precursor suitable for the plate-making by CTP.

As one of the systems for obtaining a lithographic printing plate capable of scan exposure, a constitution such that a photopolymerizable composition having an excellent photosensitive speed is used for the ink-receptive photosensitive resin layer (hereinafter referred to as a "photosensitive layer") formed on a hydrophilic support has been heretofore proposed and already put into market. The printing plate precursor having such a constitution enables simple and easy development and further assures preferred plate and printing performances such as excellent resolution, inking property, press life and scumming resistance.

The above-described photopolymerizable composition fundamentally comprises an ethylenically unsaturated compound, a photopolymerization initiation system and a binder resin, and the image formation proceeds as follows. The photopolymerization initiation system absorbs light to produce an active radical and this induces addition polymerization of the ethylenically unsaturated compound, as a result, the photosensitive layer is insolubilized.

In most of conventional proposals on the photopolymerizable composition capable of scan exposure, use of an initiation system having excellent photosensitivity is disclosed. A large number of such systems are described, for example, in "Bruce M. Monroe et al., *Chemical Revue*, Vol. 93, pp. 435-448 (1993)" and "R. S. Davidson, *Journal of Photochemistry and Biology A: Chemistry*, Vol. 73, pp. 81-96 (1993)".

As for conventional CTP systems using a photopolymerization composition comprising such an initiation system and employing a long-wavelength visible light source such as Ar laser (488 nm) and FD-YAG laser (532 nm), writing at a higher speed is demanded so as to elevate the productivity in the plate-making process. However, this requirement is not yet satisfied, because the output of light source or the sensitivity of photosensitive material is not sufficiently high.

On the other hand, for example, a semiconductor laser using an InGaN-type material and being capable of continuous oscillation in the region from 350 to 450 nm has recently come into practical use. The scan exposure system using such a short-wave light source is advantageous in that the semiconductor laser can be produced at a low cost in view of its structure and an economical system can be established while ensuring a sufficiently high output. Furthermore, as compared with systems using an FD-YAG or Ar laser, a photosensitive material having sensitivity in a short-wave region and in turn enabling operation under brighter safelight can be used.

However, a photoinitiation system having satisfactory sensitivity for scan exposure in a short-wavelength region of 350 to 450 nm is not yet known at present.

The technique for obtaining a high-sensitivity photoinitiation system is still widely demanded in the imaging field (see, for example, JP-A-2000-258910 (the term "JP-A" as used herein means an "unexamined published Japanese patent application"), "J. P. Faussier, *Photoinitiated Polymerization—Theory and Applications*": *Rapra Review*, Vol. 9, Report, Rapra Technology (1998)" and "M. Tsunooka et al., *Prog. Polym. Sci.*, 21, 1 (1996)"). A photoinitiation system comprising a sensitizing dye and an activator can generate an acid or a base other than the above-described active radical by selecting the activator and this system is used, for example, in the image formation such as stereolitlography, holography and color hard copy, in the electronic material production field such as photoresist, and in the usage for photocurable resin materials such as ink, paint and adhesive. In these industrial fields, for inducing decomposition of the activator with good efficiency, it is demanded to find out a sensitizing dye excellent in light absorptivity and sensitization ability.

With respect to the technique for prolonging the press life of the printing plate, attempts have been made to use a high-strength urethane polymer as the binder (see, for example, JP-A-3-287165), but satisfactory press life is not obtained. A lithographic printing plate satisfied in all of image formability, scumming on printing and press life is demanded.

SUMMARY OF THE INVENTION

An object of the present invention is to provide a lithographic printing plate precursor for scan exposure, which is excellent in press life, scumming resistance, stability, operability and profitability, sensitive to light at the wavelength in a wide range of 350 to 450 nm and suitable for the CTP system.

As a result of intensive investigations to achieve the above-described object, the present inventors have found that when a lithographic printing plate precursor uses a photoinitiation system comprising a fluorescent brightening agent and an activator compound as a polymerization initiator and contains a polyurethane resin binder having a specific structure, this lithographic printing plate precursor ensures high photosensitivity, excellent sensitivity and long press life. The present invention has been accomplished based on this finding.

That is, the present invention is as follows.

(1) A lithographic printing plate precursor having a photosensitive layer comprising:
  (A) a fluorescent brightening agent,
  (B) an activator compound of inducing a chemical change by the interaction with light absorption of the fluorescent brightening agent to produce at least one of a radical, an acid and a base, (C) a compound of undergoing a reaction by the effect of at least a radical, an acid or a base to irreversibly change in its physical or chemical properties, and (D) a polyurethane resin binder, wherein the polyurethane resin binder is synthesized from at least the following compounds (i), (ii), (iii) and (iv):

(i) at least one diisocyanate compound, (ii) at least one diol compound having at least one carboxyl group, (iii) at least one diol compound having a logP value of less than 0, and (iv) at least one diol compound having a logP value of 0 or more, with the proviso that the diol compounds of (iii) and (iv) are each a compound except for the diol compound of (ii).

(2) The lithographic printing plate precursor as described in (1) above, wherein the (B) activator compound of inducing a chemical change by the interaction with light absorption of the fluorescent brightening agent to produce at least one of a radical, an acid and a base is a titanocene compound or a hexaarylbimiidazole compound.

According to the present invention, a lithographic printing plate precursor satisfied in the sensitivity for scan exposure using a laser light source having a wavelength shorter than 450 nm, such as InGaN, handleable even under bright safelight and excellent in press life, scumming resistance, stability and profitability can be provided.

DETAILED DESCRIPTION OF THE INVENTION

The embodiment of the present invention is described in detail below.

[A. Photoinitiation System]

The photoinitiation system of the present invention comprises (A) a fluorescent brightening agent and (B) an activator compound of inducing a chemical change by the interaction with light absorption of the fluorescent brightening agent to produce at least one of a radical, an acid and a base.

One of the characteristic features of the (A) fluorescent brightening agent for use in the present invention is to have excellent absorption property particularly in the region of 350 to 450 nm. Furthermore, the (A) fluorescent brightening agent induces decomposition of various activator compounds with good efficiency to exhibit very high photosensitivity. As for the sensitization mechanism of the photoinitiation system comprising a fluorescent brightening agent/an activator compound of the present invention, there are known routes such as (1) reductive decomposition of the activator compound based on the electron transfer reaction from the electronic excited state of the fluorescent brightening agent to the activator compound, (2) oxidative decomposition of the activator compound based on the electron transfer from the activator compound to the electronic excited state of the fluorescent brightening agent, and (3) decomposition from the electronic excited state of the activator compound based on the energy transfer from the electronic excited state of the fluorescent brightening agent to the activator. The fluorescent brightening agent of the present invention has been found to induce any type of these sensitization reactions with excellent efficiency.

The fluorescent brightening agent as an essential component of the present inventors is very important for the elevation of sensitivity. The reason therefor is not clearly known but since this fluorescent brightening agent exhibits a high-intensity light emission (fluorescence and/or phosphorescence) spectrum, it is considered as one of the possibilities that the excitation life of the fluorescent brightening agent of the present invention is relatively long and this contributes to the efficient reaction with the activator.

(A1) Fluorescent Brightening Agent

The fluorescent brightening agent for use in the present invention is preferably a compound capable of absorbing light at a wavelength of 350 to 450 nm and emitting the absorbed light energy as fluorescence having a wavelength of 400 to 500 nm. Various properties of the fluorescent brightening agent are described in Ullmann, *Encyclopedia of Industrial Chemistry*, Sixth Edition. For the fluorescent brightening agent of the present invention, general fluorescent brightening agents all can be used, but preferred examples of the structure therefor include a stilbene structure, a distrylybenzene structure, a distrylbiphenyl structure, divinylstilbene structure, a triazinylaminostilbene structure, a stilbenyltriazole structure, a stilbenylnaphthotriazole structure, a bistriazolestilbene structure, a benzoxazole structure, a bisphenylbenzoxazole structure, a stilbenylbenzoxazole structure, a bisbenzoxazole structure, a furan structure, a benzofuran structure, a bisbenzimidazole structure, a diphenylpyrazole structure, a diphenyloxadiazole structure, a coumarin structure, a naphthimide structure, a xanethene structure, a carbostyryl structure, a pyrene structure and a 1,3,5-triazinyl structure. Among these structures, preferred are those having skeletons shown below.

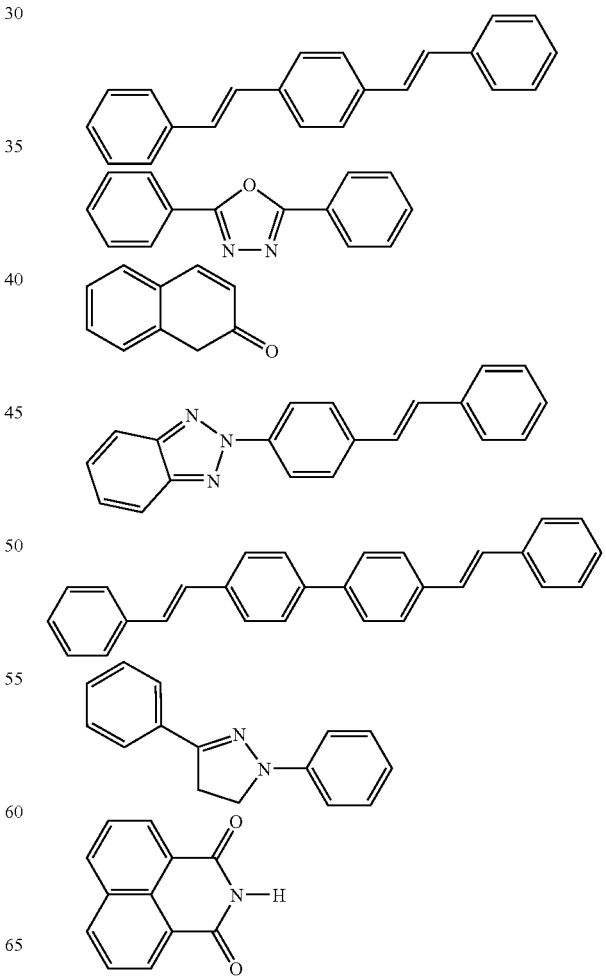

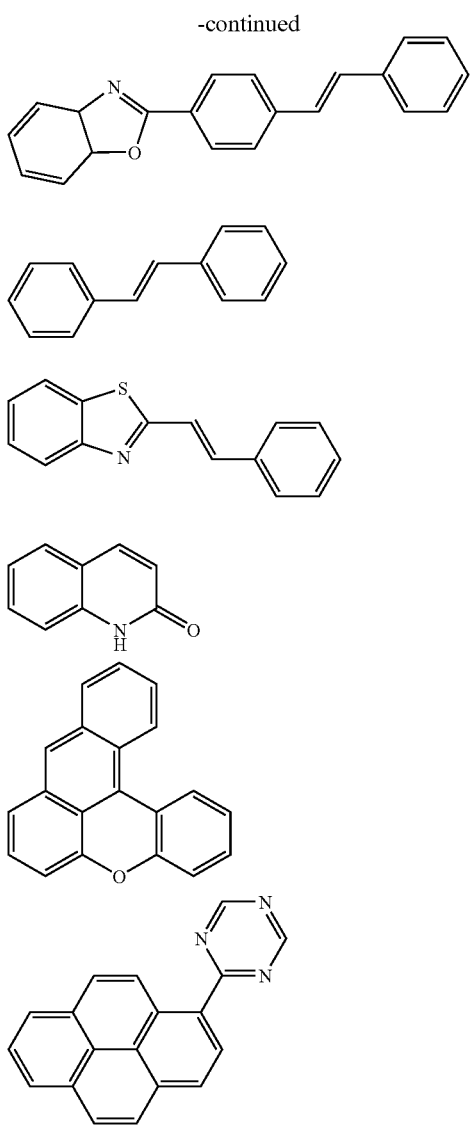

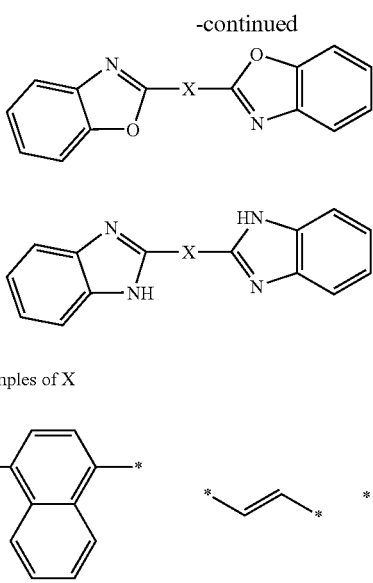

Examples of X

These skeletons for the fluorescent brightening agent of the present invention may independently have one or more substituents. Preferred examples of the substituent include an alkyl group, an alkoxy group, an alkylcarbonyl group, an alkoxycarbonyl group, an acyloxy group, a carbonyl group, a nitrile group, an amino group, a hydroxyl group, an alkylsulfonyl group and an aminosulfonyl group.

Specific preferred examples (D1) to (D18) of the fluorescent brightening agent for use in the present invention are set forth below, but the present invention is not limited thereto. Isomers by a double bond in tile skeleton structure are unclear and the present invention is not limited to either one isomer.

(D1)

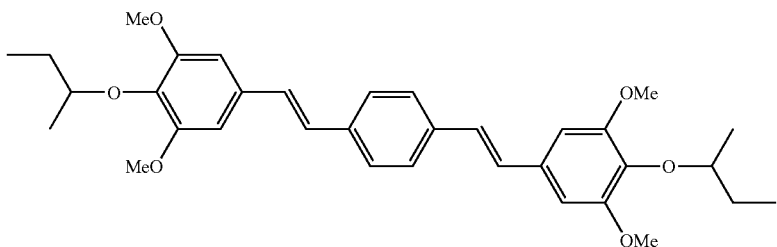

(D2)

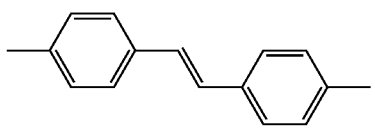

-continued
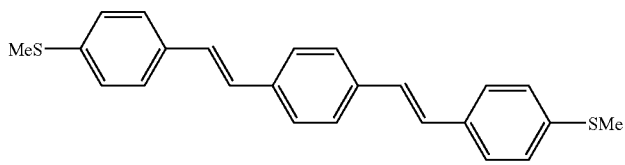
(D3)
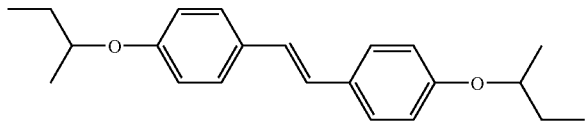
(D4)
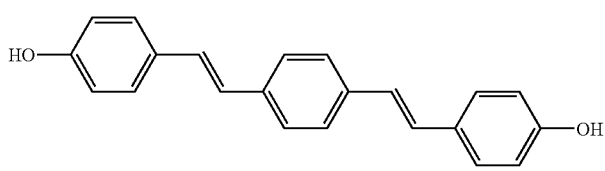
(D5)
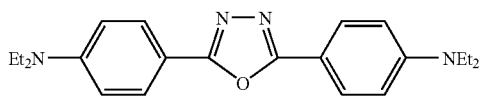
(D6)
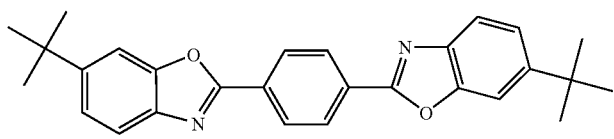
(D7)
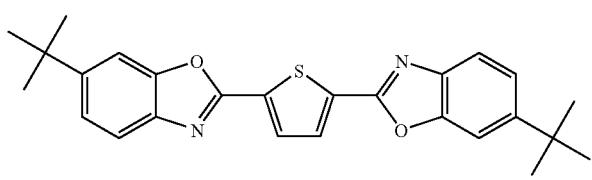
(D8)
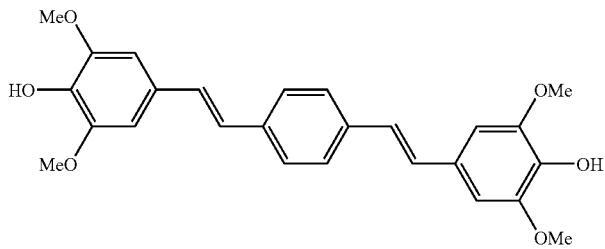
(D-9)
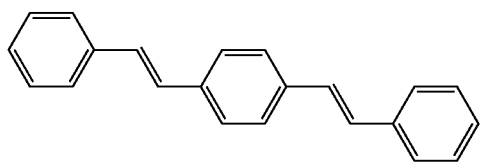
(D-10)

-continued
(D-11)
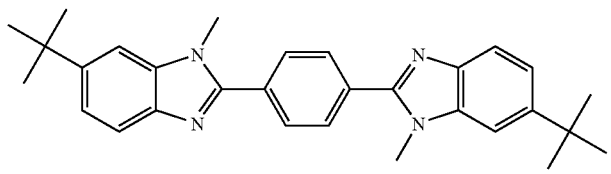
(D-12)
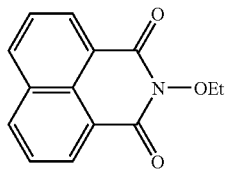
(D-13)
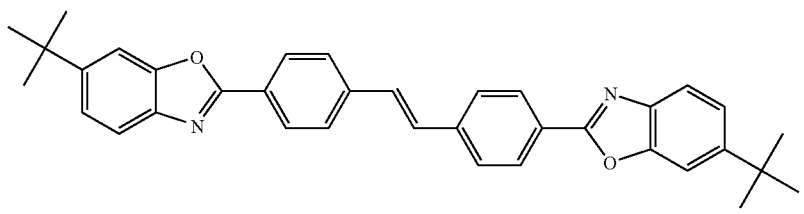
(D-14)
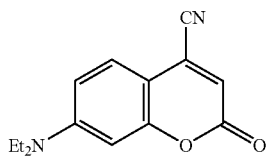
(D-15)
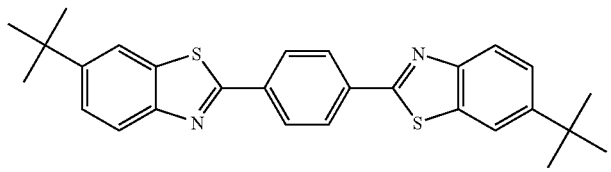
(D16)
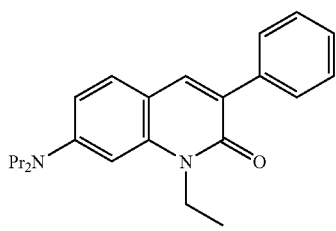
(D17)
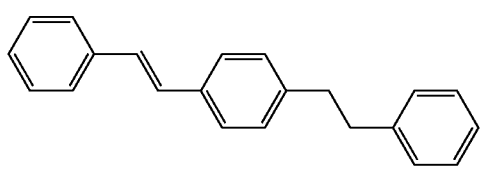
(D18)
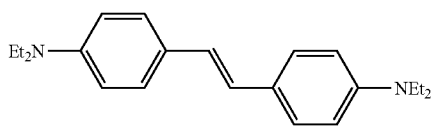

The fluorescent brightening agent for use in the present invention may be subjected to various chemical modifications so as to improve the properties of the photosensitive layer. For example, when the fluorescent brightening agent is combined with an addition polymerizable compound structure (e.g., acryloyl group, methacryloyl group) by means of covalent bonding, ionic bonding, hydrogen bonding or the like, the strength of the exposed film can be increased or unnecessary deposition from the film after exposure can be prevented. Also, when the fluorescent brightening agent is combined with a radical-, acid- or base-generating part or the like of an activator compound which is described later, the photosensitivity in the state where the concentration of initiation system is low can be remarkably elevated. Furthermore, for the purpose of enhancing the adaptability to processing with an (alkali) aqueous developer, which is a preferred use embodiment of the photosensitive layer of the present invention, it is effective to introduce a hydrophilic moiety (an acid or polar group, for example, a carboxyl group or an ester thereof, a sulfonic acid group or an ester thereof, or an ethylene oxide group). In particular, the ester-type hydrophilic group exhibits excellent compatibility in the photosensitive layer because of its relatively hydrophobic structure and at the same time, assures increase of hydrophilicity in the developer due to production of an acid group by hydrolysis. Other than these, an appropriate substituent may be introduced so as to attain enhancement of compatibility in the photosensitive layer, inhibition of crystal deposition, or the like. For example, in a certain photosensitive system, an unsaturated bond such as aryl group or allyl group is sometimes very effective for enhancement of compatibility, or when a steric hindrance is introduced between $\pi$ planes of a dye by the introduction or the like of a branched alkyl structure, the crystal deposition can be remarkably inhibited. Furthermore, adhesion to an inorganic material such as metal or metal oxide can be enhanced by the introduction of a phosphonic acid group, an epoxy group, a trialkoxysilyl group or the like. Also, formation of a fluorescent brightening agent into a polymer or the like may be used according to the purpose.

Details on use of the fluorescent brightening agent, such as structure to be used, sole or combination use and amount added, can be appropriately selected according to the performance designed for the final photosensitive material. For example, by using two kinds of fluorescent brightening agents in combination, the compatibility with the photosensitive layer can be increased. In selecting the fluorescent brightening agent, the molar extinction coefficient at the emission wavelength of the light source used is an important factor in addition to the photosensitivity. By using a dye having a large molar extinction coefficient, the amount of the fluorescent brightening agent added can be made to be relatively small and this is profitable and advantageous in view of physical properties of the photosensitive layer film. The absorbance at the wavelength of the light source has a great effect on the photosensitivity and resolution of the photosensitive layer and on the physical properties of the exposed film and therefore, the amount of the fluorescent brightening agent added is appropriately selected by taking account of these properties. For example, in the region of low absorbance of 0.1 or less, the sensitivity decreases and furthermore, low resolution results due to the effect of halation. However, for the purpose of curing a film having a large thickness of, for example, 5 μm or more, such low absorbance is rather effective in elevating the curing degree. On the other hand, in the region of high absorbance of 3 or more, the light is mostly absorbed on the surface of the photosensitive layer and curing of the inner part is inhibited, giving rise to failure in satisfying the film strength or adhesion to the substrate when used as a printing plate. In use as a lithographic printing plate where the film thickness is relatively small, the amount of the fluorescent brightening agent added is preferably selected such that the photosensitive layer has an absorbance of 0.1 to 1.5, preferably from 0.25 to 1. In the case of use as a lithographic printing plate, this is usually from 0.05 to 30 parts by mass (parts by weight), preferably from 0.1 to 20 parts by mass, more preferably from 0.2 to 10 parts by mass, per 100 parts by mass of the photosensitive layer components.

(A2) Activator Compound

The activator compound which is the second essential component of the photoinitiation system in the composition of the present invention is described. The activator compound for use in the present invention is a compound of causing a chemical change through the interaction with the electronic excited state of the fluorescent brightening agent and thereby producing at least one of a radical, an acid and a base. Hereinafter, the thus-produced radical, acid and base are simply referred to as an active species. When such a compound is not present or only an activator compound is used alone, sufficiently high sensitivity cannot be obtained in practice. Incidentally, in one embodiment of using the fluorescent brightening agent and the activator compound in combination, these may be used as a single compound by employing an appropriate chemical method (for example, linkage of fluorescent brightening agent and activator compound through a chemical bond). This mode is also included in the mode of containing the components (A) and (B) of the present invention. Such a technical idea is disclosed, for example, in Japanese Patent No. 2720195.

Most of these activator compounds are considered to usually produce an active species through the following initial chemical process (1), (2) or (3), that is, (1) reductive decomposition of the activator compound based on the electron transfer reaction from the electronic excited state of the fluorescent brightening agent to the activator compound, (2) oxidative decomposition of the activator compound based on the electron transfer from the activator compound to the electronic excited state of the fluorescent brightening agent, or (3) decomposition from the electronic excited state of the activator compound based on the energy transfer from the electronic excited state of the fluorescent brightening agent to the activator compound. To which type of (1) to (3) individual activator compounds belong is unclear in many cases, but a large characteristic feature of the fluorescent brightening agent for use in the present invention is to exhibit a very high sensitization effect no matter what type of activator compound is combined.

As for the specific activator compound, those known to one skilled in the art can be used without limitation and many specific examples thereof are described in Bruce M. Monroe et al., *Chemical Revue*, 93, 435 (1993), R. S. Davidson, *Journal of Photochemistry and Biology A: Chemistry*, 73, 81 (1993), J. P. Faussier, "*Photoinitiated Polymerization—Theory and Applications*": *Rapra Review*, Vol. 9, Report, Rapra Technology (1998), and M. Tsunooka et al., *Prog. Polym. Sci.*, 21, 1 (1996). Furthermore, as for other compounds having functions of (1) and (2) above, compounds of undergoing oxidative or reductive bond cleavage are also known, such as those described in F. D. Saeva, *Topics in Current Chemistry*, 156, 59 (1990), G. G. Maslak, *Topics in Current Chemistry*, 168, 1 (1993), H. B. Shuster et al., *JACS*, 112, 6329 (1990), and I. D. F. Eaton et al., *JACS*, 102, 3298 (1980).

Specific examples of preferred activator compounds are described below by classifying them into (a) those which produce an active species by undergoing reduction to cause bond cleavage, (b) those which produce an active species by undergoing oxidation to cause bond cleavage, and (c) others. However, to which class individual compounds belong is not commonly accepted in many cases and the present invention is not restricted by the description on these reaction mechanisms.

(a) Activator Compounds Which Produce Active Species by Undergoing Reduction to Cause Bond Cleavage Compound Having Carbon-Halogen Bond:

This compound is considered to generate an active species resulting from reductive cleavage of carbon-halogen bond (described, for example, in *Polymer Preprints, Jpn.*, 41 (3), 542 (1992)). As for the active species, a radical or an acid can be generated. Specific examples of the suitably usable compound include halomethyl-s-triazines, halomethyloxadiazoles which can be easily synthesized by one skilled in the art according to the synthesis method described in M. P. Hutt, E. F. Elslager and L. M. Merbel, *Journal of Heterocyclic Chemistry*, 7, 511 (1970), and compounds described in German Patents 2641100, 3333450, 3021590 and 3021599.

Compound Having Nitrogen-Nitrogen Bond or Nitrogen-Containing Heterocyclic Ring—Nitrogen-Containing Heterocyclic Ring Bond:

This compound undergoes reductive bond cleavage (described, for example, in *J. Phys. Chem.*, 96, 207 (1992)). Specific examples of the compound which can be suitably used include hexaarylbiimidazoles. The active species produced is a lophine radical which initiates a radical chain reaction by the use in combination with a hydrogen donor, if desired. In addition, image formation using an oxidation reaction by a lophine radical is also known (described in *J. Imaging Sci.*, 30, 215 (1986)).

Compound Having Oxygen-Oxygen Bond:

This compound is considered to generate an active radical resulting from reductive cleavage of oxygen-oxygen bond (described, for example, in *Polym. Adv. Technol.*, 1, 287 (1990). Specific examples of the compound which can be suitably used include organic peroxides. A radical can be generated as the active species.

Onium Compound:

This compound is considered to generate an active species resulting from reductive cleavage of carbon-hetero bond or oxygen-nitrogen bond (described, for example, in *J. Photopolym. Sci. Technol.*, 3, 149 (1990)). Specific examples of the compound which can be suitably used include iodonium salts described in European Patent 104143, U.S. Pat. No. 4,837,124, JP-A-2-150848 and JP-A-2-96514, sulfonium salts described in European Patents 370693, 233567, 297443, 297442, 279210 and 422570, and U.S. Pat. Nos. 3,902,144, 4,933,377, 4,760,013, 4,734,444 and 2,833,827, diazonium salts (e.g., benzenediazonium which may have a substituent), diazonium salt resins (e.g., formaldehyde resin of diazodiphenylamine), N-alkoxypyridinium salts (for example, those described in U.S. Pat. No. 4,743,528, JP-A-63-138345, JP-A-63-142345, JP-A-63-142346 and JP-B-46-42363 (the term "JP-B" as used herein means an "examined Japanese patent publication"), such as 1-methoxy-4-phenylpyridinium tetrafluoroborate), and compounds described in JP-B-52-147277, JP-B-52-14278 and JP-B-52-14279. A radical or an acid is produced as the active species.

Active Esters:

For example, nitrobenzyl esters of sulfonic acid or carboxylic acid, esters of sulfonic acid or carboxylic acid with N-hydroxy compound (e.g., N-hydroxyphthalimide, oxime), sulfonic acid esters of pyrogallol, and naphthoquinonediazido-4-sulfonic acid esters can be reductively decomposed. As for the active species, a radical or an acid can be generated. Specific examples of the sulfonic acid esters include nitrobenzyl ester compounds described in European Patents 0290750, 046083, 156153, 271851 and 0388343, U.S. Pat. Nos. 3,901,710 and 4,181,531, JP-A-60-198538 and JP-A-53-133022, iminosulfonate compounds described in European Patents 0199672, 84515, 199672, 044115 and 0101122, U.S. Pat. Nos. 4,618,564, 4,371,605 and 4,431,774, JP-A-64-18143, JP-A-2-245756 and JP-A-4-365048, compounds described in JP-B-62-6223, JP-B-63-14340 and JP-A-59-174831, and compounds shown below.

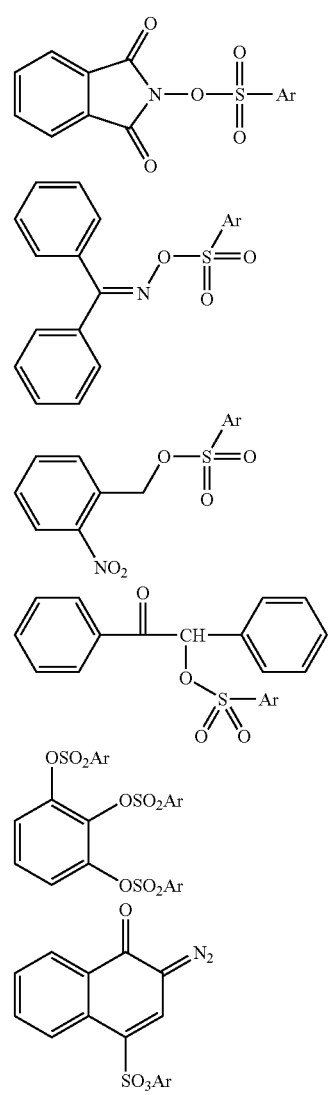

(wherein Ar represents an aromatic or aliphatic group which may be substituted).

A base can also be produced as the active species and, for example, the following compounds are known.

Ferrocene and Iron Allene Complexes:

These compounds can reductively produce an active radical. Specific examples thereof include those disclosed in JP-A-1-304453 and JP-A-1-152109.

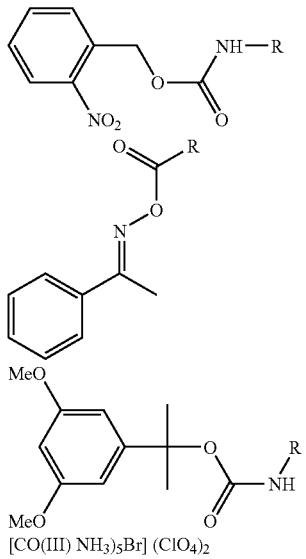

[CO(III) NH₃)₅Br] (ClO₄)₂

(wherein R represents an aliphatic or aromatic group which may be substituted).

Disulfones:

These compounds can generate an acid by causing reductive cleavage of S—S bond. For example, diphenyldisulfones described in JP-A-61-166544 are known.

(b) Activators Which Produce Active Species by Undergoing Oxidation to Cause Bond Cleavage Alkylate Complex:

This compound is considered to produce an active radical resulting from oxidative cleavage of carbon-hetero bond (described, for example, in *J. Am. Chem. Soc.*, 112, 6329 (1990)). Specific examples of the complex which can be suitably used include triaryl alkylborates.

Alkylamine Compound:

This compound is considered to produce an active radical resulting from cleavage of C—X bond on the carbon adjacent to nitrogen upon oxidation (described, for example, in *J. Am. Chem. Soc.*, 116, 4211 (1994)). Preferred examples of X include a hydrogen atom, a carboxyl group, a trimethylsilyl group and a benzyl group. Specific examples of the compound include ethanolamines, N-phenylglycines and N-trimethylsilylmethylamines.

Sulfur- or Tin-Containing Compound:

The compound in which nitrogen atom of the above-described amines is replaced by a sulfur or tin atom can produce an active radical by the same action. Also, the compound having an S—S bond is known to effect sensitization resulting from S—S cleavage.

α-Substituted Methylcarbonyl Compound:

This compound can produce an active radical resulting from cleavage of carbonyl-α carbon bond upon oxidation. The compound in which the carbonyl is converted into an oxime ether also exhibits the same action. Specific examples thereof include 2-alkyl-1-[4-(alkylthio)phenyl]-2-morpholinopulonone-1 compounds, and oxime ethers obtained by reacting these compounds with hydroxyamines and then etherifying N—OH.

Sulfinic Acid Salts:

These compounds can reductively produce an active radical. Specific examples thereof include sodium arylsulfinate.

(c) Others

Although the sensitization mechanism is not clearly known, many compounds can function as an activator compound. Specific examples thereof include organic metal compounds such as titanocene, aromatic ketones, acylphosphines and biacylphosphines. As for the active species, a radical or an acid can be generated.

Out of the activator compounds for use in the present invention, preferred compounds which are particularly excellent in the sensitivity and stability are specifically described below.

(1) Halomethyltriazines

A compound represented by the following formula [I] is included. This compound is particularly excellent in the radical or acid generating ability.

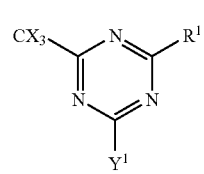

[I]

In formula [I], X represents a halogen atom, $Y^1$ represents $-CX_3$, $-NH_2$, $-NHR^{1'}$, $-N(R^{1'})_2$ or $-OR^{1'}$ (wherein $R^{1'}$ represents an alkyl group, a substituted alkyl group, an aryl group or a substituted aryl group), and $R^1$ represents $-CX_3$, an alkyl group, a substituted alkyl group, an aryl group, a substituted aryl group or a substituted alkenyl group.

Specific examples of this compound include compounds described in Wakabayashi et al., *Bull. Chem. Soc. Japan*, 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine. Other examples include compounds described in British Patent 1388492, such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine, compounds described in JP-A-53-133428, such as 2-(4-methoxy-naphtho-1-yl)-4,6-bis-trichloromethyl-S-triazine, 2-(4-ethoxy-naphtho-1-yl)-4,6-bis-trichloromethyl-S-triazine, 2-[4-(2-ethoxyethyl)-naphtho-1-yl]-4,6-bis-trichloromethyl-S-triazine, 2-(4,7-dimethoxy-naphtho-1-yl)-4,6-bis-trichloromethyl-S-triazine and 2-(acenaphtho-5-yl)-4,6-bis-trichlormethyl-S-triazine, and compounds described in German Patent 3337024, such as compounds shown below:

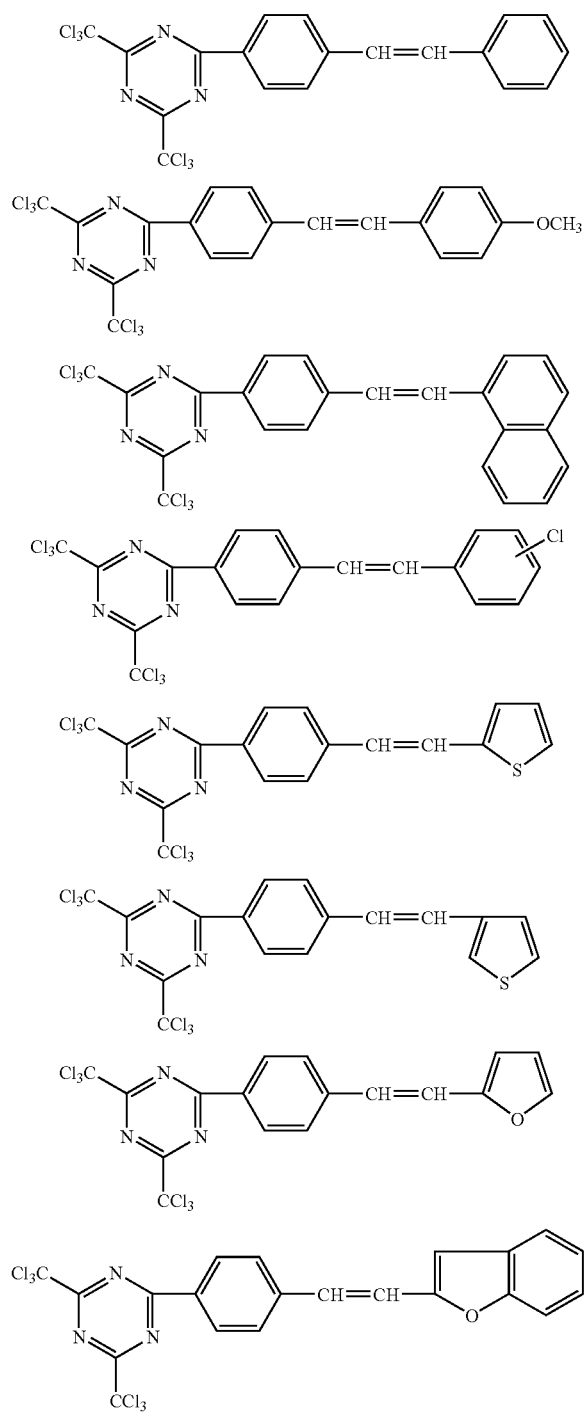

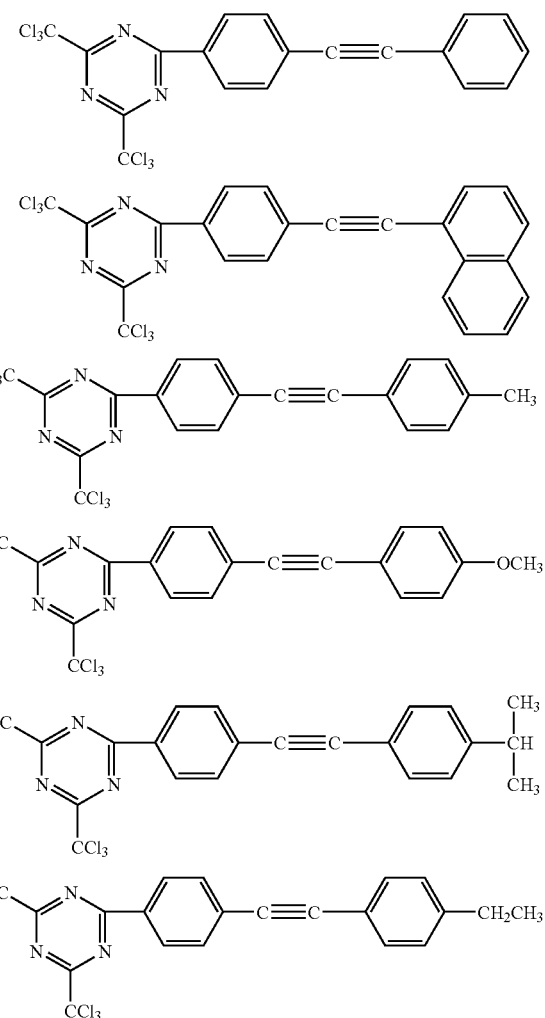

Other examples include compounds described in F. C. Schaefer et al., *J. Org. Chem,* 29, 1527 (1964), such as 2-methyl-4,6-bis(tribromomethyl)-S-triazine, 2,4,6-tris(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine and 2-methoxy-4-methyl-6-trichloromethyl-S-triazine.

Other examples include compounds described in JP-A-62-58241, such as compounds shown below:

Other examples include compounds described in JP-A-5-281728, such as compounds shown below:

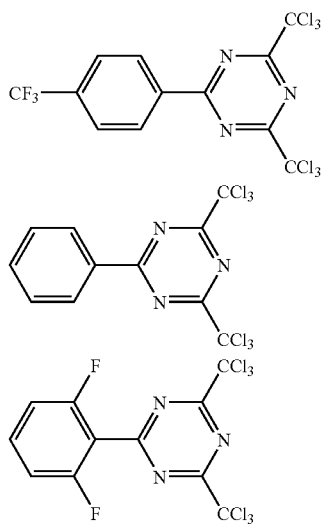

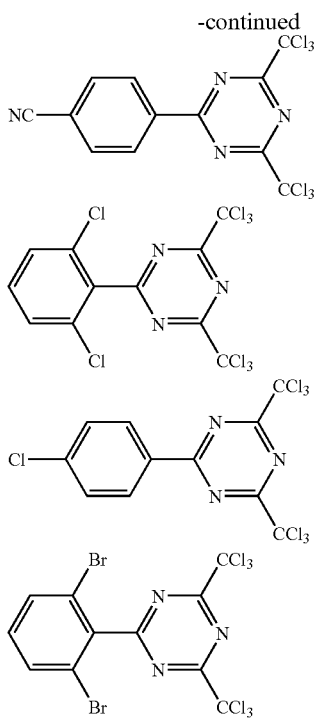

(2) Titanocenes

The titanocene compound which is particularly suitable as the activator compound may be any titanocene compound as long as it can generate an active species when irradiated with light in the coexistence of the above-described fluorescent brightening agent, and may be appropriately selected from known compounds described, for example, in JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

Specific examples thereof include di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl and bis(cyclopentadienyl)-bis(2,6-difluoro-3-(pir-1-yl)phenyl)titanium.

(3) Borate Salt Compounds

The borate salts represented by the following formula [II] are excellent in the radical generating ability.

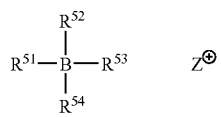

[II]

In formula [II], $R^{51}$, $R^{52}$, $R^{53}$ and $R^{54}$ may be the same or different and each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, and two or more groups of $R^{51}$, $R^{52}$, $R^{53}$ and $R^{54}$ may combine to form a cyclic structure, with the proviso that at least one of $R^{51}$, $R^{52}$, $R^{53}$ and $R^{54}$ is a substituted or unsubstituted alkyl group. $Z^+$ represents an alkali metal cation or a quaternary ammonium cation.

The alkyl group of $R^{51}$ to $R^{54}$ includes a linear, branched or cyclic alkyl group and is preferably an alkyl group having from 1 to 18 carbon atoms. Specific examples thereof include methyl, ethyl, propyl, isopropyl, butyl, pentyl, hexyl, octyl, stearyl, cyclobutyl, cyclopentyl and cyclohexyl. Examples of the substituted alkyl group include the above-described alkyl group where a halogen atom (e.g., —Cl, —Br), a cyano group, a nitro group, an aryl group (preferably a phenyl group), a hydroxy group, a group shown below:

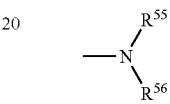

(wherein $R^{55}$ and $R^{56}$ each independently represents a hydrogen atom, an alkyl group having from 1 to 14 carbon atoms or an aryl group), —COOR$^{57}$ (wherein $R^{57}$ represents a hydrogen atom, an alkyl group having from 1 to 14 carbon atoms or an aryl group), —COOR$^{58}$ or —OR$^{59}$ (wherein $R^{58}$ and $R^{59}$ each represents an alkyl group having from 1 to 14 carbon atoms or an aryl group) is present as a substituent.

Examples of the aryl group of $R^{51}$ to $R^{54}$ include an aryl group having from 1 to 3 rings, such as phenyl group and naphthyl group, and examples of the substituted aryl group include the above-described aryl group where a substituent described above for the substituted alkyl group, or an alkyl group having from 1 to 14 carbon atoms is present.

Examples of the alkenyl group of $R^{51}$ to $R^{54}$ include a linear, branched or cyclic alkenyl group having from 2 to 18 carbon atoms, and examples of the substituent of the substituted alkenyl group include the substituents described above for the substituted alkyl group.

Examples of the alkynyl group of $R^{51}$ to $R^{54}$ include a linear or branched alkynyl group having from 2 to 28 carbon atoms, and examples of the substituent of the substituted alkynyl group include the substituents described above for the substituted alkyl group.

Examples of the heterocyclic group of $R^{51}$ to $R^{54}$ includes a 5- or more-membered heterocyclic group containing at least one of N, S and O. The heterocyclic group is preferably a 5-, 6- or 7-membered heterocyclic group, and a condensed ring may be contained in the heterocyclic group. The heterocyclic group may also have a substituent described above as the substituent of the substituted aryl group.

Specific examples of the compound represented by formula [II] include compounds described in U.S. Pat. Nos. 3,567,453 and 4,343,891 and European Patents 109772 and 109773, and compounds shown below.

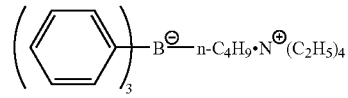

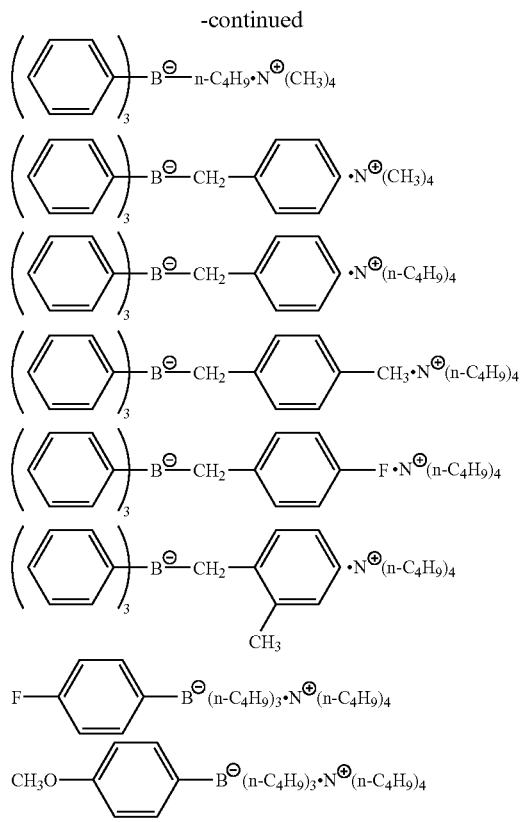

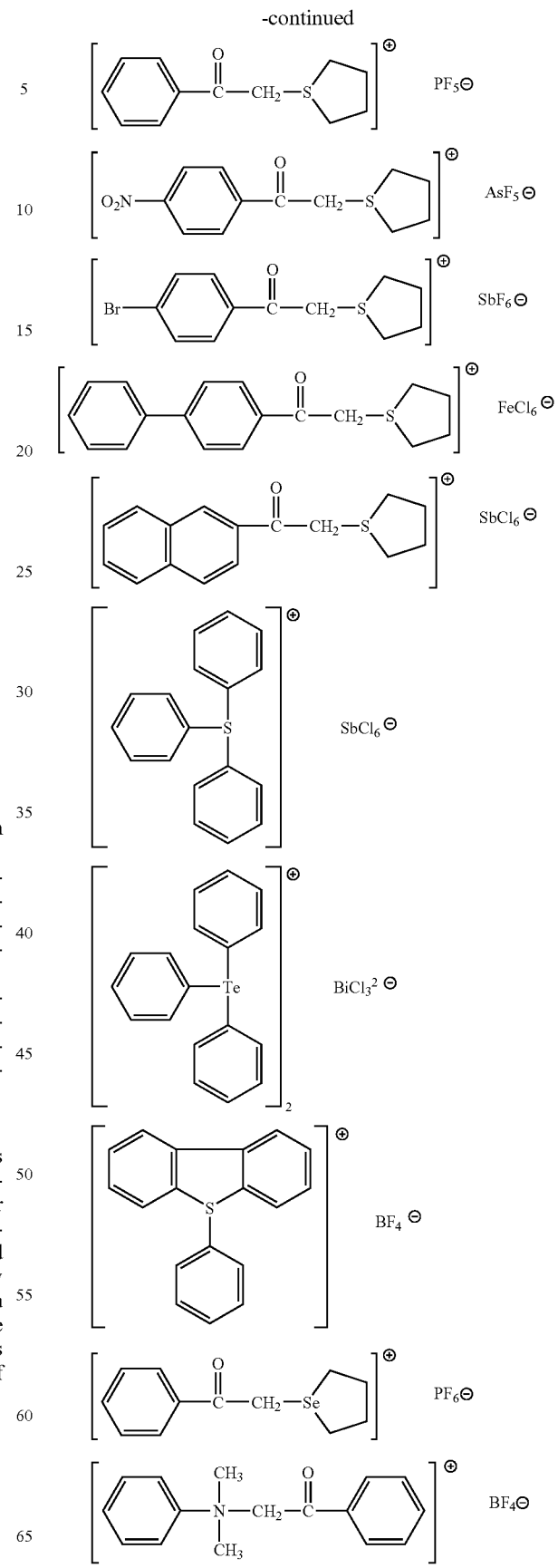

(4) Hexaarylbiimidazoles

The hexaarylbiimidazoles have excellent stability and can generate a radial with high sensitivity.

Specific examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

(5) Onium Salt Compounds

The onium compounds of elements belonging to Groups 15 (5B), 16 (6B) and 17 (7B) of the Periodic Table, specifically, N, P, As, Sb, Bi, O, S, Se, Te and I, are an activator compound having excellent sensitivity. Among these, iodonium and sulfonium salts, particularly diaryliodonium and triarylsulfonium salt compounds, are very excellent in view of both sensitivity and storage stability. An acid and/or a radical can be generated and either one or both thereof can be properly generated by appropriately selecting the conditions on use according to the purpose. Specific examples thereof include the compounds set forth below.

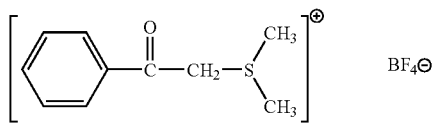

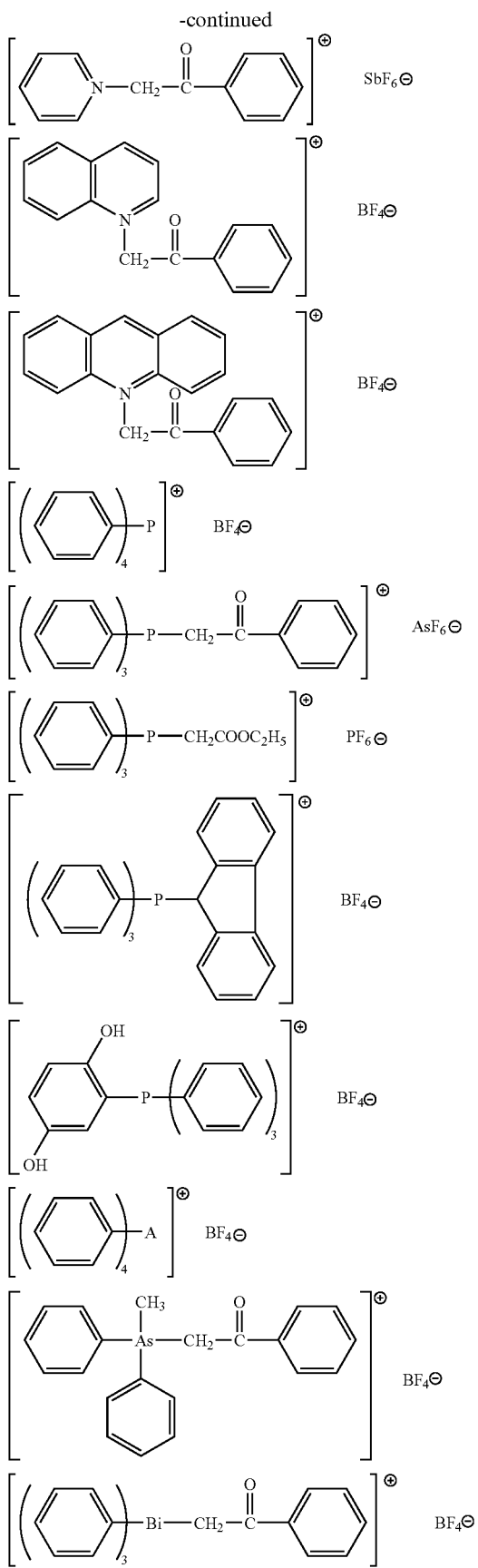
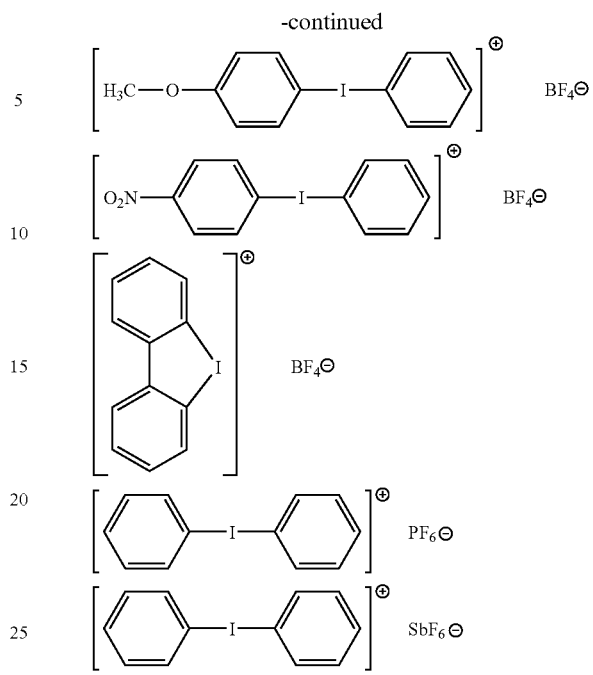

(6) Organic Peroxide

In the case of using an organic peroxide-type activator compound, a radical can be generated as the active species with remarkably high sensitivity.

The "organic peroxide" includes almost all organic compounds having one or more oxygen-oxygen bond within the molecule, but examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-dimethyl-2,5-di(tert-butylperoxy)hexyne-3, acetyl peroxide, isobutyryl peroxide, octanoyl peroxide, decanoyl peroxide, lauroyl peroxide, 3,5,5-trimethylhexanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tert-butyl peroxybenzoate, di-tert-butyl peroxyisophthalate, 2,5-dimethyl-2,5-di(benzoylperoxy)hexane, tert-butyl maleic peroxide, tert-butyl peroxyisopropylcarbonate, 3,3',4,4'-tetra-(tert-butylperoxycarbonyl)benzophenone, 3,3',4,4'-tetra-(tert-amylperoxycarbonyl)benzophenone, 3,3',4,4'-tetra-(tert-hexylperoxycarbonyl)benzophenone, 3,3',4,4'-tetra-(tert-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone, carbonyl di(tert-butylperoxydihydrogendiphthalate) and carbonyl di(tert-hexylperoxydihydrogendiphthalate).

Among these, preferred are peroxide ester systems such as 3,3',4,4'-tetra-(tert-butylperoxycarbonyl)benzophenone, 3,3',4,4'-tetra-(tert-amylperoxycarbonyl)benzophenone, 3,3',4,4'-tetra-(tert-hexylperoxycarbonyl)benzophenone, 3,3',4,4'-tetra-(tert-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone and di-tert-butyl diperoxyisophthalate.

Among these activator compounds, preferred are (1) halomethyltriazines, (2) titanocenes and (4) hexaarylbiimidazoles, more preferred are (4) hexaarylbiimidazoles.

These activator compounds may also be subjected to various chemical modifications so as to improve the properties of the photosensitive layer, similarly to the fluorescent brightening agent described above. Examples of the method which can be used therefor include bonding with the fluorescent brightening agent, addition-polymerizable unsaturated compound or other activator part, introduction of a hydroplilic moiety, introduction of a substituent for enhancing compatibility or preventing crystal deposition, introduction of a substituent for improving adhesion, and formation into a polymer.

The use method of such an activator compound can also be appropriately and arbitrarily selected according to the performance designed for the photosensitive material, similarly to the fluorescent brightening agent described above. For example, when two or more kinds of activator compounds are used in combination, compatibility in the photosensitive layer can be elevated. Usually, it is advantageous in view of photosensitivity to use the activator compound in a large amount. When the activator compound is used in an amount of 0.5 to 80 parts by mass, preferably from 1 to 50 parts by mass, per 100 parts by mass of the photosensitive layer components, satisfactory photosensitivity can be obtained. On the other hand, like titanocene compound, when the activator compound itself has absorption in the visible light region, the amount of the activator compound used is preferably smaller in view of fogging due to light in the vicinity of 500 nm when used under yellow or white light, but even if the amount of activator compound used is decreased to 6 parts by mass or less, further to 1.9 parts by mass or less, still further to 1.4 parts by mass or less, sufficiently high photosensitivity can be obtained by virtue of its combination with the fluorescent brightening agent of the present invention.

[B. Component (C)]

The third essential component (C) for use in the present invention is a compound which irreversibly changes in its physical or chemical properties under the action of the active species produced upon photoreaction of the above-described photoinitiation system, and an arbitrary compound can be used as the component (C) without limitation as long as it exhibits such a behavior. For example, the compounds described above regarding the initiation system exhibit such a behavior in many cases. The properties of the component (C), which are changed under the action of a radical, acid or base produced from the photoinitiation system, include physical properties from the molecular aspect, such as absorption spectrum (color), chemical structure and polarizability, and physical properties from the material aspect, such as solubility, strength, refractive index, fluidity and adhesive property.

For example, when like a pH indicator, the compound used as the component (C) undergoes change in the absorption spectrum depending on the pH and an acid or base is generated from the initiation system, color tint only in the exposed area can be changed. Such a composition is useful as an image-forming material. Similarly, when a compound of undergoing change in the absorption spectrum by oxidation-reduction or nucleophilic addition reaction is used as the component (C), image formation can be effected by inducing oxidation, reduction or the like under the action of a radical produced from the initiation system. Examples of such changes are disclosed in *J. Am. Chem. Soc.*, 108, 128 (1986), *J. Imagine. Sci.*, 30, 215 (1986), and *Israel. J. Chem.*, 25, 264 (1986).

Furthermore, when a compound capable of addition polymerization or polycondensation is used as the component (C) and combined with an initiation system, a photocurable resin or negative photopolymer can be formed.

As the component (C), a radical polymerizable compound (for example, a compound having an ethylenically unsaturated bond), a cationic polymerizable compound (for example, an epoxy compound, a vinyl ether compound and a methylol compound) or an anionic polymerizable compound (for example, an epoxy compound) is used. These compounds are described, for example, in TAPJ (compiler), *Photopolymer Handbook*, Kogyo Chosakai Publishing, Inc., and *Kobunshi (Polymer)*, 45, 786 (1996). Also, a composition in which a thiol compound is used as the component (C) and combined with a photoradical generating system is well known.

It is also effective to use an acid-decomposable compound as the component (C) and combine it with a photoacid generator. For example, a material using a polymer of which side or main chain decomposes under the action of an acid, and undergoing change in the solubility, hydrophilicity/hydrophobicity or the like by the effect of light is broadly used in practice as a photodecomposition-type photosensitive resin or a positive photopolymer. Specific examples thereof include those described in *ACS. Symp. Ser.*, 242, 11 (1984), JP-A-60-3625, U.S. Pat. Nos. 5,102,771, 5,206,317 and 5,212,047, JP-A-4-26850, JP-A-3-1921731, JP-A-60-10247 and JP-A-62-40450.

The component (C) particularly useful for obtaining a high-sensitivity lithographic printing plate which is one of the objects of the present invention is an addition-polymerizable compound having an ethylenically unsaturated double bond, and this compound is described in detail below.

(C-1) Addition-Polymerizable Compound

The addition-polymerizable compound having at least one ethylenically unsaturated double bond, which is a preferred component (C) for use in the present invention, is selected from compounds having at least one, preferably two or more, terminal ethylenically unsaturated bond(s). These compounds are widely known in this industrial field and can be used in the present invention without any particular limitation. These compounds have a chemical mode such as a monomer, a prepolymer (namely, dimer, trimer or oligomer) or a mixture or copolymer thereof. Examples of the monomer or a copolymer thereof include an unsaturated carboxylic acid (e.g., acrylic acid, methacrylic acid, itaconic acid, crotonic acid, isocrotonic acid, maleic acid), and esters and amides thereof. Among these, esters of an unsaturated carboxylic acid with an aliphatic polyhydric alcohol compound, and amides of an unsaturated carboxylic acid with an aliphatic polyvalent amine compound are preferred. Also, for example, an addition reaction product of an unsaturated carboxylic acid ester or amide having a nucleophilic substituent such as hydroxyl group, amino group or mercapto group with a monofunctional or polyfunctional isocyanate or epoxy, and a dehydrating condensation reaction product with a monofunctional or polyfunctional carboxylic acid, may be suitably used. Furthermore, an addition reaction product of an unsaturated carboxylic acid ester or amide having an electrophilic substituent such as isocyanate group or epoxy group with a monofunctional or polyfunctional alcohol, amine or thiol, and a displacement reaction product of an unsaturated carboxylic acid ester or amide having a disorptive substituent such as halogen group or tosyloxy group with a monofunctional or polyfunctional alcohol, amine or thiol, may also be suitably used. Other than these, compounds resulting from replacing the unsaturated carboxylic acid of the above-described compounds by an unsaturated phosphonic acid, styrene, vinyl ether or the like may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of the crotonic acid ester include ethylene glycol dicrotonate, tetramethylene glycol dicrotonate, pentaerythritol dicrotonate and sorbitol tetradicrotonate.

Examples of the isocrotonic acid ester include ethylene glycol diisocrotonate, pentaerythritol diisocrotonate and sorbitol tetraisocrotonate.

Examples of the maleic acid ester include ethylene glycol dimaleate, triethylene glycol dimaleate, pentaerythritol dimaleate and sorbitol tetramaleate.

Other examples of the ester which can be suitably used include aliphatic alcohol-based esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

These ester monomers may also be used as a mixture thereof.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other preferred examples of the amide-based monomer include those having a cyclohexylene structure described in JP-B-54-21726.

A urethane-based addition-polymerizable compound produced by using an addition reaction of an isocyanate with a hydroxyl group is also preferred, and specific examples thereof include vinyl urethane compounds having two or more polymerizable vinyl groups within one molecule described in JP-B-48-41708, which are obtained by adding a vinyl monomer containing a hydroxyl group represented by the following formula (III) to a polyisocyanate compound having two or more isocyanate groups within one molecule.

$$CH_2=C(R)COOCH_2CH(R')OH \tag{III}$$

(wherein R and R' each represents H or $CH_3$).

In addition, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used.

Furthermore, when an addition-polymerizable compound having an amino or sulfide structure within the molecule described in JP-A-63-277653, JP-A-63-260909 and JP-A-1-105238 is used, a photopolymerizable composition having remarkably excellent photosensitization speed can be obtained.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. Also, specific unsaturated compounds described in JP-B-46-43946, JP-B-1-40337 and JP-B-1-40336, and vinyl phosphonic acid-based compounds described in JP-A-2-25493 may be used. In some cases, a structure containing a perfluoroalkyl group described in JP-A-61-22048 is suitably used. Furthermore, those described as a photocurable monomer or oligomer in *Adhesion*, Vol. 20, No. 7, pp. 300-308 (1984) may also be used.

Details on use of the addition-polymerizable compound, such as structure to be used, sole or combination use and amount added, can be freely selected according to the performance designed for the final photosensitive material. For example, these are selected from the following aspects. In the light of photosensitization speed, a structure having a larger unsaturated group content per molecule is preferred and in most cases, a bifunctional or greater functional compound is preferred. For increasing the strength of image area, namely, cured layer, a trifunctional or greater functional compound is preferred. Also, a method of controlling both photosensitivity and strength by using a combination of compounds differing in the functional number or in the polymerizable group (for example, an acrylic acid ester, a methacrylic acid ester, a styrene-based compound or a vinyl ether-based compound) is effective. A compound having a large molecular weight or a compound having high hydrophobicity is sometimes not preferred in view of development speed or precipitation in the developer, despite excellent photosensitization speed or film strength. The selection and use method of the addition-polymerizable compound are important factors also for compatibility and dispersibility with other components (e.g., binder polymer, initiator, colorant) in the photosensitive layer. For example, the compatibility may be improved in some cases by using a low purity compound or using two or more compounds in combination. Also, a specific structure may be selected for the purpose of improving the adhesion to the support, overcoat layer or the like. With respect to the blending ratio of the addition-polymerizable compound in the photosensitive layer, a larger ratio is advantageous in terms of sensitivity, but if excessively large, undesired phase separation may occur or there may arise a problem in view of production process due to tackiness of the photosensitive layer (for example, production failure ascribable to transfer or sticking of photosensitive material component), a problem of precipitation from the developer or a problem in storage stability. From these standpoints, in many cases, the blending ratio of the addition-polymerizable compound is preferably from 25 to 75 mass %, more preferably from 35 to 65 mass %, based on all components in the composition for forming the photosensitive layer. The addition-polymerizable compounds may be used individually or in combination of two or more thereof. Other than these, as for the use method of the addition-polymerizable compound, an appropriate structure, formulation or amount added can be freely selected by taking account of the degree of polymerization inhibition due to oxygen, resolution, fogging, change in refractive index, surface tackiness and the like. Depending on the case, a layer structure or coating method such as undercoat and overcoat can also be employed.

[D. Polyurethane Resin Binder]

The polyurethane resin binder for use in the present invention is described.

The polyurethane resin binder as an essential component of the photosensitive layer of the present invention is synthesized from at least the following compounds (i), (ii), (iii) and (iv):
  (i) at least one diisocyanate compound,
  (ii) at least one diol compound having at least one carboxyl group,
  (iii) at least one diol compound having a logP value of less than 0, and
  (iv) at least one diol compound having a logP value of 0 or more,
with the proviso that said diol compounds of (iii) and (iv) are each a compound except for the diol compound of (ii).

By using this binder, even if the acid value of the photosensitivity layer is low, the exposed area can be prevented from development damage without decreasing the developability of the unexposed area, and both good scumming resistance and high press life can be achieved.

(i) Diisocyanate Compound

The diisocyanate compound includes a diisocyanate compound represented by formula (1):

OCN-L-NCO    (1)

wherein L represents a divalent aliphatic or aromatic hydrocarbon group which may have a substituent. If desired, L may contain another functional group which does not react with the isocyanate group, such as carbonyl group, ester group, urethane group, amido group and ureido group.

More specifically, L represents a single bond or a divalent aliphatic or aromatic hydrocarbon group which may have a substituent (preferably, for example, an alkyl group, an aralkyl group, an aryl group, an alkoxy group or a halogeno group), preferably an alkylene group having from 1 to 20 carbon atoms or an arylene group having from 6 to 15 carbon atoms, more preferably an alkylene group having from 1 to 8 carbon atoms. Furthermore, if desired, L may contain another functional group which does not react with the isocyanate group, such as carbonyl group, ester group, urethane group, amido group, ureido group or ether group.

Specific examples of the diisocyanate compound include the followings:
aromatic diisocyanate compounds such as 2,4-tolylene diisocyanate, dimerized 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; aliphatic diisocyanate compounds such as hexamethylene diisocyanate, trimethylhexamethylene diisocyanate, lysine diisocyanate and dimeric acid diisocyanate; alicyclic diisocyanate compounds such as isophorone diisocyanate, 4,4'-methylenebis(cyclohexylisocyanate), methylcyclohexane-2,4(or 2,6)-diisocyanate and 1,3-(isocyanatomethyl)cyclohexane; and diisocyanate compounds which are a reaction product of a diol with a diisocyanate, such as adduct of 1,3-butylene glycol (1 mol) and tolylene diisocyanate (2 mol).

The diisocyanate compounds may be used individually or in combination of two or more thereof. In view of balance between press life and scumming resistance, two or more diisocyanate compounds are preferably used in combination, and it is particularly preferred to use at least one aromatic diisocyanate compound (L is an aromatic group) and at least one aliphatic diisocyanate compound (L is an aliphatic group).

The amount of diisocyanate used is, in terms of the molar ratio to all diol compounds, preferably from 0.8 to 1.2, more preferably from 0.9 to 1.1. In the case where the diisocyanate compound is used in excess for the diol compound and an isocyanate group remains at the polymer terminal, the polymer is preferably treated with an alcohol or amine after the completion of urethanation and finally synthesized in the form of allowing for no remaining of an isocyanate group.

(ii) At least One Diol Compound Having at Least One Carboxl Group

The at least one diol compound having at least one carboxyl group includes diol compounds of formulae (2), (3) and (4) and/or compounds resulting from ring-opening a tetracarboxylic acid dianhydride by a diol compound. As for the diol compound used for ring-opening the carboxylic acid dianhydride, the diol compound described later as (iii) or (iv) can be used.

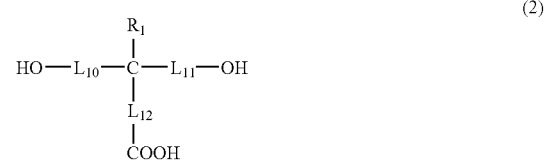

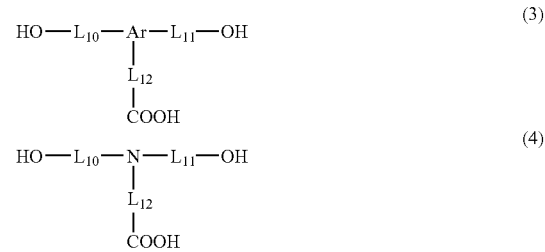

In the formulae, $R_1$ represents a hydrogen atom or an alkyl, aralkyl, aryl, alkoxy or aryloxy group which may have a substituent (examples of the substituent include a cyano group, a nitro group, a halogen atom (e.g., —F, —Cl, —Br, —I), —CONH$_2$, —COOR$_{113}$, —OR$_{113}$, —NHCONHR$_{113}$, —NHCOOR$_{113}$, —NHCOR$_{113}$ and —OCONHR$_{113}$ (wherein R$_{113}$ represents an alkyl group having from 1 to 10 carbon atoms or an aralkyl group having from 7 to 15 carbon atoms)), preferably a hydrogen atom, an alkyl group having from 1 to 8 carbon atoms or an aryl group having from 6 to 15 carbon atoms.

L$_{10}$, L$_{11}$, and L$_{12}$ may be the same or different and each represents a single bond or a divalent aliphatic or aromatic hydrocarbon group which may have a substituent (preferably, for example, an alkyl group, an aralkyl group, an aryl group, an alkoxy group or a halogeno group), preferably an alkylene group having from 1 to 20 carbon atoms or an arylene group having from 6 to 15 carbon atoms, more preferably an alkylene group having from 1 to 8 carbon atoms. If desired, L$_{10}$, L$_{11}$ and L$_{12}$ each may contain another functional group which does not react with the isocyanate group, such as carbonyl group, ester group, urethane group, amido group, ureido group and ether group. Two or three of R$_1$, L$_{10}$, L$_{11}$ and L$_{12}$ may form a ring.

Ar represents a trivalent aromatic hydrocarbon group which may have a substituent, preferably an aromatic group having from 6 to 15 carbon atoms.

Specific examples of the diol compounds having a carboxyl group, represented by formulae (2), (3) and (4), include the followings:

3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis-(hydroxymethyl)butyric acid, 4,4-bis(4-hydroxyphenyl)pentanoic acid, tartaric acid, N,N-dihydroxyethylglycine and N,N-bis(2-hydroxyethyl)-3-carboxy-propionamide.

The tetracarboxylic acid dianhydride which is preferably used in the production of the at least one diol compound having at least one carboxyl group includes the compounds represented by formulae (5), (6) and (7):

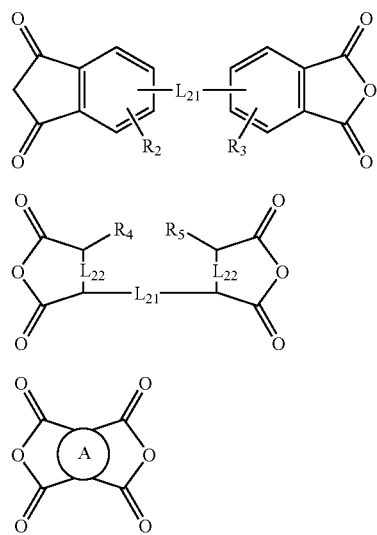

In the formulae, L$_{21}$ represents a single bond, a divalent aliphatic or aromatic hydrocarbon group which may have a substituent (preferably, for example, an alkyl group, an aralkyl group, an aryl group, an alkoxy group, a halogeno group, an ester group or an amido group), —CO—, —SO—, —SO$_2$—, —O— or —S—, preferably a single bond, a divalent aliphatic hydrocarbon group having from 1 to 15 carbon atoms, —CO—, —SO$_2$—, —O— or —S—. R$_2$ and R$_3$ may be the same or different and each represents a hydrogen atom, an alkyl group, an aralkyl group, an aryl group, an alkoxy group or a halogeno group, preferably a hydrogen atom, an alkyl group having from 1 to 8 carbon atoms, an aryl group having from 6 to 15 carbon atoms, an alkoxy group having from 1 to 8 carbon atoms or a halogeno group. Two of L$_{21}$, R$_2$ and R$_3$ may combine to form a ring. R$_4$ and R$_5$ may be the same or different and each represents a hydrogen atom, an alkyl group, an aralkyl group, an aryl group or a halogeno group, preferably a hydrogen atom, an alkyl group having from 1 to 8 carbon atoms or ail aryl group having from 6 to 15 carbon atoms. Two of L$_{21}$, R$_4$ and R$_5$ may combine to form a ring. L$_{22}$ and L$_{23}$ may be the same or different and each represents a single bond, a double bond or a divalent aliphatic hydrocarbon group, preferably a single bond, a double bond or a methylene group. A represents a mononuclear or polynuclear aromatic ring, preferably an aromatic ring having from 6 to 18 carbon atoms.

Specific examples of the compounds represented by formulae (5), (6) and (7) include the followings:

aromatic tetracarboxylic dianhydrides such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphosphoryldiphenylene)-bis(iminocarbonyl)]diphthalic dianhydride, an adduct of hydroquinone diacetate and trimellitic anhydride, and an adduct of diacetyldiamine and trimellitic anhydride; alicyclic tetracarboxylic dianhydrides such as 5-(2,5-dioxotetrahydrofuryl)-3-methyl-3-cyclohexene-1,2-dicarboxylic anhydride (Epiclon B-4400, produced by Dai-Nippon Ink & Chemicals, Ind.), 1,2,3,4-cyclopentanetetracarboxylic dianhydride, 1,2,4,5-cyclohexanetetracarboxylic dianhydride and tetrahydrofurantetracarboxylic dianhydride; and aliphatic tetracarboxylic dianhydrides such as 1,2,3,4-butanetetracarboxylic dianhydride and 1,2,4,5-pentanetetracarboxylic dianhydride.

The (ii) at least one diol compound having at least one carboxyl group can be synthesized by ring-opening such a tetracarboxylic dianhydride with a diol compound. However, the polyurethane resin may also be synthesized by first performing the reaction between the diol compound and (i) the diisocyanate compound, and reacting the obtained reactant with the above-described tetracarboxylic dianhydride, and this method is also included in the aspect of the present invention. That is, the method for introducing a structural unit originated in a tetracarboxylic dianhydride and a diol compound into the polyurethane resin includes the following methods:

(a) a method of reacting the diisocyanate compound with an alcohol-terminated compound obtained by ring-opening a tetracarboxylic dianhydride with a diol compound, and (b) a method of reacting a tetracarboxylic dianhydride with an alcohol-terminated urethane compound obtained by reacting the diisocyanate compound under diol compound-excess conditions.

Out of the compounds for the at least one diol compound having at least one carboxyl group, the compound represented by formula (2) is preferred because the solubility in solvent is high and the synthesis is easy. The at least one diol compound having at least one carboxyl group is introduced into the polyurethane resin binder such that the polyurethane resin binder contains a carboxyl group in an amount of 0.2 to 4.0 meq/g, preferably from 0.3 to 3.0 meq/g, more preferably from 0.4 to 2.0 meq/g, still more preferably from 0.5 to 1.5 meq/g, and most preferably from 0.6 to 1.2 meq/g. Accordingly, the content of the structure originated in the (ii) at least one diol compound having at least one carboxyl group, in the polyurethane resin binder, is appropriately selected according to the number of carboxyl groups, the other diol component used, the acid value of the obtained polyurethane resin binder, or the composition, pH or the like of the developer, but the content is, for example, from 5 to 45 mol %, preferably from 10 to 40 mol %, more preferably from 15 to 35 mol %.

(iii) At least One Diol Compound having logP Value of Less than 0

The logP value in the diol compounds of (iii) and (iv) is a value having the same definition as that described later with respect to the nonionic surfactant in the developer, and this value can be calculated from known data in the same manner as described later.

The diol compound having a logP value of less than 0 can be used without any particular limitation, but the diol compound having a carboxyl group is excluded. The diol compound having a logP value of less than 0 includes an ethylene glycol compound represented by formula (A'):

HO—(CH$_2$CH$_2$O)$_n$—H (A')

(wherein n represents an integer of 1 or more).

This diol compound also includes a random or block copolymer having a logP value of less than 0, which is a copolymer of an ethylene oxide having a hydroxyl group at the terminal with a propylene oxide.

Furthermore, an ethylene oxide adduct of bisphenol A (added molar number of ethylene oxide: 27 to 100), an ethylene oxide adduct of bisphenol F (added molar number of ethylene oxide: 22 to 100), an ethylene oxide adduct of hydrogenated bisphenol A (added molar number of ethylene oxide: 23 to 100), and an ethylene oxide adduct of hydrogenated bisphenol F (added molar number of ethylene oxide: 18 to 100) can also be used. The diol compounds having a logP value of less than 0 may be used individually or in combination of two or more thereof but are preferably used individually in view of stability (sensitivity, press life or the like) of the printing plate.

In view of scumming resistance, the logP value of the diol compound having a logP value of less than 0 is preferably from −10 to −0.5, more preferably from −8 to −1, still more preferably from −5 to −1.2. More specifically, the ethylene glycol compound represented by formula (A') is preferred in view of scumming resistance, the ethylene glycol compound where n is from 2 to 50 is more preferred, the ethylene glycol where n is from 3 to 30 is still more preferred, and the ethylene glycol compound where n is from 4 to 10 is particularly preferred. The content of the at least one diol compound having a logP value of less than 0 in the polyurethane resin binder is appropriately selected according to the other diol component used, the acid value or molecular weight of the obtained polyurethane resin binder, or the composition, pH or the like of the developer, but the content is preferably from 1 to 45 mol %, more preferably from 5 to 40 mol %, still more preferably from 10 to 35 mol %, particularly preferably from 15 to 30 mol %.

(iv) At least One Diol Compound Having logP Value of 0 or More

As for the at least one diol compound having a logP value of 0 or more, any diol compound may be used without any particular limitation as long as it has a logP value of 0 or more. However, the diol compound having a carboxyl group is not included in this at least one diol compound having a logP value of 0 or more.

Specific examples of the compound include 1,2-propylene glycol, di-1,2-propylene glycol, tri-1,2-propylene glycol, tetra-1,2-propylene glycol, hexa-1,2-propylene glycol, 1,3-propylene glycol, di-1,3-propylene glycol, tri-1,3-propylene glycol, tetra-1,3-propylene glycol, 1,3-butylene glycol, di-1,3-butylene glycol, tri-1,3-butylene glycol, hexa-1,3-butylene glycol, polypropylene glycol having an average molecular weight of 400, polypropylene glycol having an average molecular weight of 700, polypropylene glycol having an average molecular weight of 1,000, polypropylene glycol having an average molecular weight of 2,000, polypropylene glycol having an average molecular weight of 3,000, polypropylene glycol having an average molecular weight of 4,000, neopentyl glycol, 2-butene-1,4-diol, 2,2,4-trimethyl-1,3-pentanediol, 1,4-bis-β-hydroxyethoxycyclohexane, 1,4-butanediol, 1,5-pentanediol, 1,6-hexanediol, 1,7-heptanediol, 1,8-octanediol, cyclohexanedimethanol, tricyclodecanedimethanol, hydrogenated bisphenol A, hydrogenated bisphenol F, an ethylene oxide adduct of bisphenol A (added molar number of ethylene oxide: 26 or less), an ethylene oxide adduct of bisphenol F (added molar number of ethylene oxide: 21 or less), an ethylene oxide adduct of hydrogenated bisphenol A (added molar number of ethylene oxide: 22 or less), an ethylene oxide adduct of hydrogenated bisphenol F (added molar number of ethylene oxide: 17 or less), a propylene oxide adduct of bisphenol A, a propylene oxide adduct of bisphenol F, a propylene oxide adduct of hydrogenated bisphenol A, a propylene oxide adduct of hydrogenated bisphenol F, hydroquinonedihydroxyethyl ether, p-xylylene glycol, dihydroxyethylsulfone, bis(2-hydroxyethyl)-2,4-tolylene dicarbamate, 2,4-tolylene-bis(2-hydroxyethylcarbamide), bis(2-hydroxyethyl)-m-xylylene dicarbamate and bis(2-hydroxyethyl)isophthalate.

Polyether diol compounds having a logP value of 0 or more, which are compounds represented by the following formulae (A), (B), (C), (D) and (E), can also be suitably used.

HO—(CH$_2$CH—O)$_a$—H (A)
         |
         R$_6$

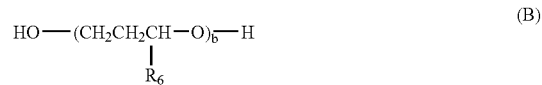

HO—(CH$_2$CH$_2$CH—O)$_b$—H (B)
            |
            R$_6$

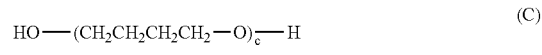

HO—(CH$_2$CH$_2$CH$_2$CH$_2$—O)$_c$—H (C)

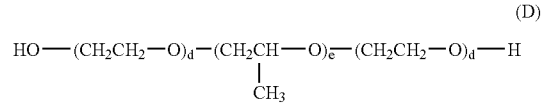

HO—(CH$_2$CH$_2$—O)$_d$—(CH$_2$CH—O)$_e$—(CH$_2$CH$_2$—O)$_d$—H (D)
                              |
                              CH$_3$

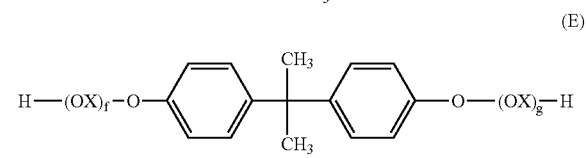

H—(OX)$_f$—O—⟨aryl⟩—C(CH$_3$)$_2$—⟨aryl⟩—O—(OX)$_g$—H (E)

In the formulae, $R_6$ represents a hydrogen atom or a methyl group. However, in formula (A), $R_6$ represents a methyl group. X represents a group shown below:

 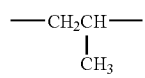

a, b, c, d, e, f and g each represents an integer of 2 or more, preferably an integer of 2 to 100.

Polyester diol compounds having a logP value of 0 or more represented by the following formulae (8) and (9) are also included as specific examples of the diol of (iv).

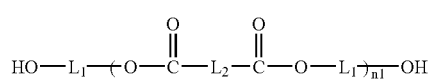

(8)

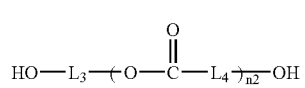

(9)

In the formulae, $L_1$, $L_2$ and $L_3$ may be the same or different and each represents a divalent aliphatic or aromatic hydrocarbon group, and $L_4$ represents a divalent aliphatic hydrocarbon group. $L_1$, $L_2$ and $L_3$ each preferably represents an alkylene group, an alkenylene group, an alkynylene group or an arylene group, and $L_4$ preferably represents an alkylene group. In $L_1$, $L_2$, $L_3$ and $L_4$, another functional group which does not react with the isocyanate group, such as ether group, carbonyl group, ester group, cyano group, olefin group, urethane group, amido group, ureido group and halogen atom, may be present. n1 and n2 each represents an integer of 2 or more, preferably an integer of 2 to 100.

A polycarbonate diol compound having a logP value of 0 or more represented by the following formula (10) is also included as a specific example.

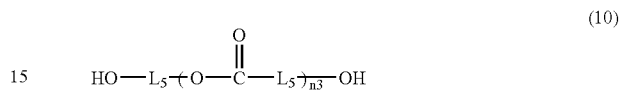

(10)

In the formula, $L_5$s may be the same or different and each represents a divalent aliphatic or aromatic hydrocarbon group. $L_5$ is preferably an alkylene group, an alkenylene group, an alkynylene group or an arylene group. In $L_5$, another functional group which does not react with the isocyanate group, such as ether group, carbonyl group, ester group, cyano group, olefin group, urethane group, amido group, ureido group and halogen atom, may be present. n3 represents an integer of 2 or more, preferably an integer of 2 to 100.

Specific examples of the diol compounds represented by formulae (8), (9) and (10) are set forth below. In these examples, n represents an integer of 2 or more.

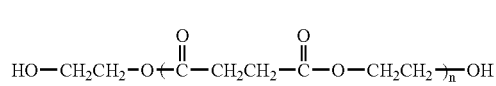

(No. 1)

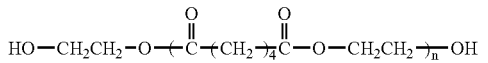

(No. 2)

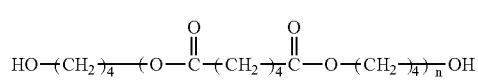

(No. 3)

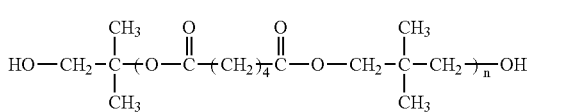

(No. 4)

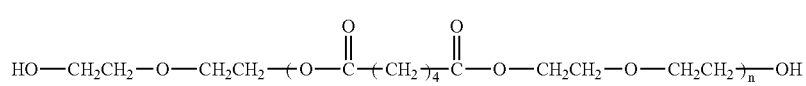

(No. 5)

(No. 6)

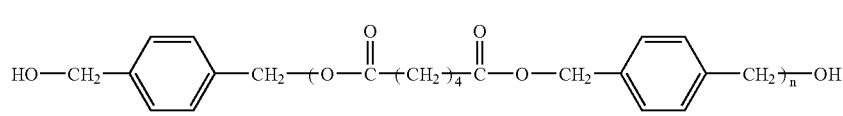

(No. 7)

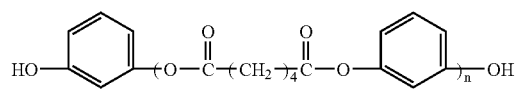

(No. 8)

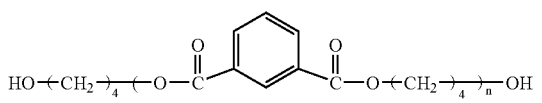

(No. 9)

-continued (No. 10)
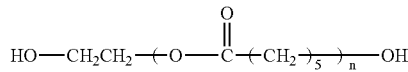

(No. 11)
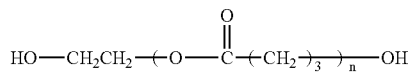

(No. 12)
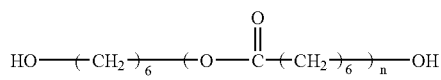

(No. 13)
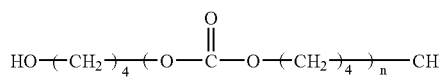

(No. 14)
HO—(CH₂)₆—(O—C(=O)—(CH₂)₆)ₙ—OH (No. 15)
HO—(CH₂)₅—(O—C(=O)—O—(CH₂)₅)ₙ—OH (No. 16)
HO—(CH₂)₄—(O—C(=O)—O—(CH₂)₄)ₙ—CH (No. 17)
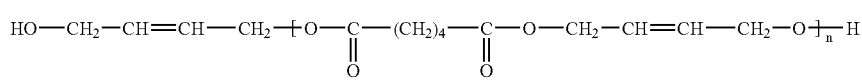

(No. 18)
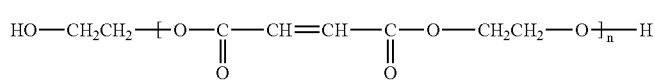

(No. 19)
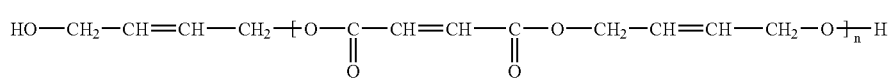

(No. 20)
HO—CH₂—CH=CH—CH₂—(O—C(=O)—CH=CH—C(=O)—O—CH₂—CH=CH—CH₂—O)ₙ—H (No. 22)
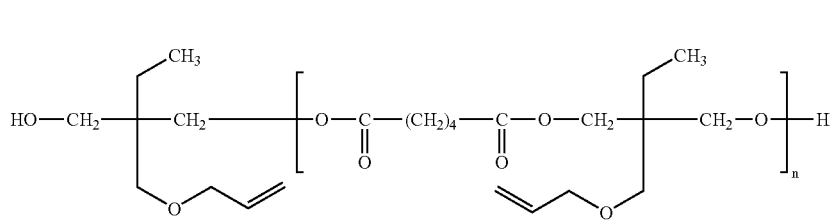

(No. 23)
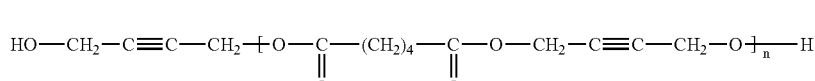

(No. 24)
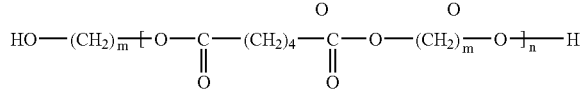

m = 2.4

In addition, a diol compound having a logP value of 0 or more, which does not contain a carboxyl group and may have a substituent of not reacting with the isocyanate group, can also be used as the diol compound of (iv).

Examples of such a diol compound include compounds represented by the following formulae (11) and (12).

HO-L₆-O—CO-L₇-CO—O-L₆-OH    (11)

HO-L₇-CO—O-L₆-OH    (12)

In the formulae, $L_6$ and $L_7$ may be the same or different and each represents a divalent aliphatic or aromatic hydrocarbon group or a divalent heterocyclic group, which may have a substituent (examples of the substituent include an alkyl group, an aralkyl group, an aryl group, an alkoxy group, an aryloxy group and a halogen atom (e.g., —F, —Cl, —Br, —I)). If desired, $L_6$ and $L_7$ each may contain another functional group which does not react with the isocyanate group, such as carbonyl group, ester group, urethane group, amido group and a ureido group. $L_6$ and $L_7$ may form a ring.

Specific examples of the compounds represented by formulae (11) and (12) are set forth below.

(No. 101)

$\text{benzene-1,2-(COO-CH}_2\text{CH}_2\text{-OH)}_2$ (No. 102)

$\text{benzene-1,3-(COO-CH}_2\text{CH}_2\text{-OH)}_2$ (No. 103)

benzene-1,4-(CH$_2$COO-CH$_2$CH$_2$-OH)(COO-CH$_2$CH$_2$-OH)

(No. 104)

HO-CH$_2$CH$_2$-O-CO-(furan-2,5-diyl)-COO-CH$_2$CH$_2$-OH (No. 105)

HO-CH$_2$CH$_2$-O-CO-CH=CH-COO-CH$_2$CH$_2$-OH (No. 106)

HO-CH$_2$CH$_2$-O-COC$_{11}$H$_{22}$COO-CH$_2$CH$_2$-OH (No. 107)

HO-CH$_2$CH$_2$-O-COC$_{12}$H$_{24}$COO-CH$_2$CH$_2$-OH (No. 108)

HO-CH$_2$CH$_2$-O-COC$_{14}$H$_{28}$COO-CH$_2$CH$_2$-OH (No. 109)

HO-CH$_2$CH$_2$-O-CO-C(CH$_3$)$_2$-COO-CH$_2$CH$_2$-OH (No. 110)

HO-CH$_2$CH$_2$-O-CO-C≡C-COO-CH$_2$CH$_2$-OH (No. 111)

HO-CH$_2$CH$_2$-O-CO-CH$_2$-C(CH$_3$)$_2$-COO-CH$_2$CH$_2$-OH (No. 112)

cyclohexane-1,2-(COO-CH$_2$CH$_2$-OH)$_2$ (No. 113)

HO-CH$_2$CH$_2$-O-CO-CH$_2$-O-CH$_2$-COO-CH$_2$CH$_2$-OH (No. 114)

HO-CH$_2$CH$_2$-O-CO-C(=CH$_2$)-COO-CH$_2$CH$_2$-OH (No. 115)

HO-CH$_2$CH$_2$-O-CO-CH$_2$-N(CH$_3$)-CH$_2$-COO-CH$_2$CH$_2$-OH (No. 116)

HO-CH$_2$CH$_2$-O-CO-CH$_2$CH$_2$-C(=O)-COO-CH$_2$CH$_2$-OH (No. 117)

HO-CH$_2$CH$_2$-O-CO-(pyridine-2,6-diyl)-COO-CH$_2$CH$_2$-OH (No. 118)

pyrazine-2,3-(COO-CH$_2$CH$_2$-OH)$_2$ (No. 119)

benzene-1,3-(COO-(CH$_2$)$_4$-OH)$_2$ (No. 120)

HO-(C$_6$H$_4$)-COO-CH$_2$CH$_2$-OH (4-hydroxy)

(No. 121)

1-hydroxy-naphthalene-2-COO-CH$_2$CH$_2$-OH (No. 122)

HO-(C$_6$H$_4$)-CH=CH-COO-CH$_2$CH$_2$-OH (4-hydroxy)

(No. 123)

HO-CH$_2$CH$_2$-COO-CH$_2$CH$_2$-OH (No. 124)

HO-CH$_2$-C(CH$_3$)$_2$-COO-CH$_2$CH$_2$-OH

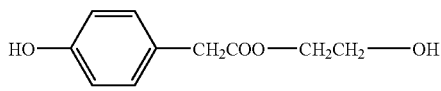 (No. 125)

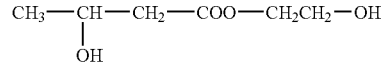 (No. 126)

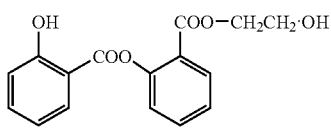 (No. 127)

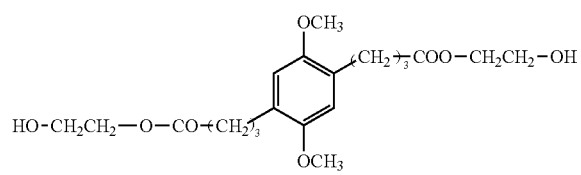 (No. 128)

Furthermore, compounds represented by the following formulae (16) to (18) can also be suitably used as the diol compound of (iv).

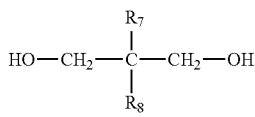 (16)

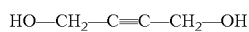 (17)

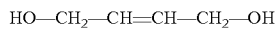 (18)

In the formulae, $R_7$ and $R_8$ may be the same or different and each represents an alkyl group which may have a substituent, preferably an alkyl group having from 1 to 10 carbon atoms, which may be have a substituent such as cyano group, nitro group, halogen atom (e.g., —F, —Cl, —Br, —I), —CONH$_2$, —COOR and —OR (wherein Rs may be the same or different and each represents an alkyl group having from 1 to 10 carbon atoms, an aryl group having from 7 to 15 carbon atoms or an aralkyl group).

Specific examples of the diol compound represented by formula (16) are set forth below.

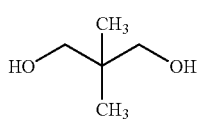 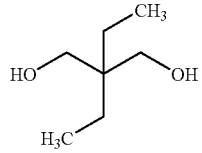

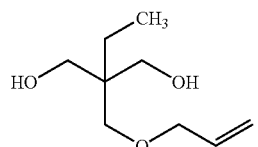 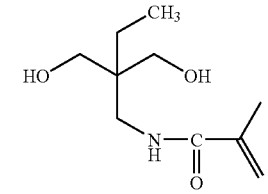

Specific examples of the diol compound represented by formula (17) include 2-butyne-1,4-diol, and specific examples of the diol compound represented by formula (18) include cis-2-butene-1,4-diol and trans-2-butene-1,4-diol.

In addition, diol compounds represented by the following formulae (19) and (20) can also be suitably used.

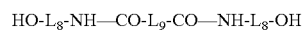 (19)

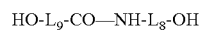 (20)

In the formulae, $L_8$ and $L_9$ may be the same or different and each represents a divalent aliphatic or aromatic hydrocarbon group or a divalent heterocyclic group, which may have a substituent (examples of the substituent include an alkyl group, an aralkyl group, an aryl group, an alkoxy group, an aryloxy group and a halogen atom (e.g., —F, —Cl, —Br, —I)). If desired, $L_8$ and $L_9$ each may contain another functional group which does not react with the isocyanate group, such as carbonyl group, ester group, urethane group, amido group and ureido group. $L_8$ and $L_9$ may form a ring.

Specific examples of the compounds represented by formulae (19) and (20) are set forth below.

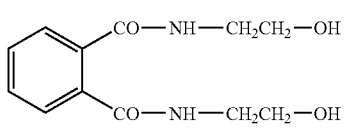 (No. 201)

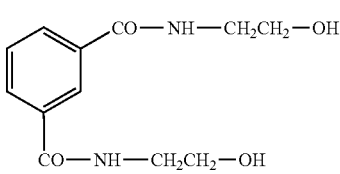 (No. 202)

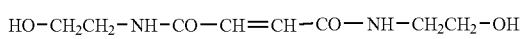 (No. 203)

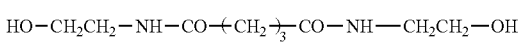 (No. 204)

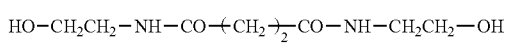 (No. 205)

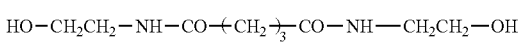 (No. 206)

-continued (No. 207)
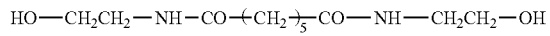

(No. 208)
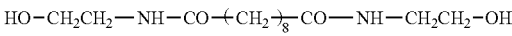

(No. 209)
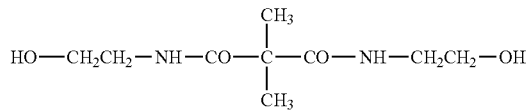

(No. 210)
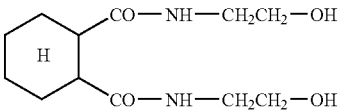

(No. 211)
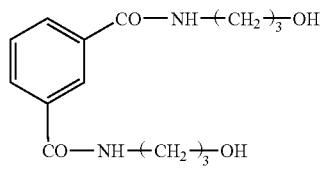

(No. 212)
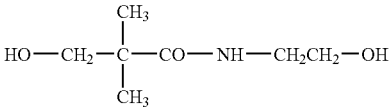

(No. 213)
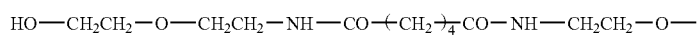

(No. 214)

(No. 215)
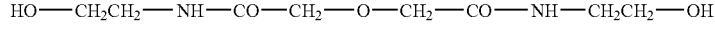

(No. 216)
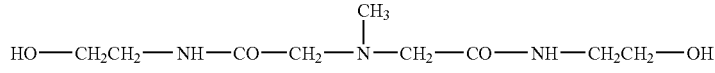

(No. 217)
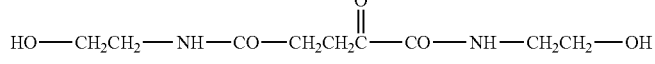

(No. 218)
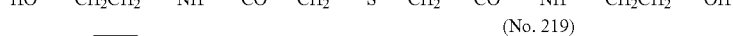

(No. 219)

(No. 220)

Furthermore, diol compounds represented by the following formulae (21) and (22) can also be suitably used.

$$HO-Ar_2-(L_{16}-Ar_3)_n-OH \quad (21)$$

$$HO-Ar_2-L_{16}-OH \quad (22)$$

In the formulae, $L_{16}$ represents a divalent aliphatic hydrocarbon group which may have a substituent (preferred examples of the substituent include an alkyl group, an aralkyl group, an aryl group, an alkoxy group, an aryloxy group and a halogeno group). If desired, $L_{16}$ may contain another functional group which does not react with the isocyanate group, such as ester group, urethane group, amido group and ureido group.

$Ar_2$ and $Ar_3$ may be the same or different and each represents a divalent aromatic hydrocarbon group which may have a substituent, preferably an aromatic group having from 6 to 15 carbon atoms.

n represents an integer of 0 to 10.

Specific examples of the diol compounds represented by formulae (21) and (22) include the followings:

catechol, resorcin, hydroquinone, 4-methylcatechol, 4-tert-butylcatechol, 4-acetylcatechol, 3-methoxycatechol, 4-phenylcatechol, 4-methylresorcin, 4-ethylresorcin, 4-tert-butylresorcin, 4-hexylresorcin, 4-chlororesorcin, 4-benzylresorcin, 4-acetylresorcin, 4-carbomethoxyreorcin, 2-methylresorcin, 5-methylresorcin, tert-butylhydroquinone, 2,5-di-tert-butylhydroquinone, 2,5-di-tert-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)hexane, 1,4-bis(2-(p-hydroxyphenyl)propyl) benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-tert-butylbenzyl alcohol, 4-hydroxy-3,5-di-tert-butylbenzyl alcohol, 4-hydroxyphenethyl alcohol, 2-hydroxyethyl-4-hydroxybenzoate, 2-hydroxyethyl-4-hydroxyphenylacetate and resorcin mono-2-hydroxyethyl ether. The diol compounds shown below can also be suitably used.

In view of the press life, the logP value of the diol compound having a logP value of 0 or more of (iv) for use in the present invention is preferably from 0.5 to 30, more preferably from 1 to 20, still more preferably from 2 to 15, particularly preferably from 3 to 15. The compounds represented by formulae (A) to (E) are preferred because good press life is obtained. Among these, the polypropylene glycol represented by formula (A) (where $R_6$ is a methyl group) is more preferred. Furthermore, among the polypropylene glycols represented by formula (A) (where $R_6$ is a methyl group), in view of balance between press life and scumming resistance, compounds where a is from 5 to 50 are preferred, compounds where a is from 10 to 40 are more preferred, and compounds where a is from 15 to 30 are still more preferred.

The content of the structure originated in the at least one diol compound having a logP value of 0 or more, in the urethane resin binder, is appropriately selected according to the logP value of the diol compound used, the other diol component used, the acid value or molecular weight of the obtained urethane resin binder, or the composition, pH or the like of the developer, but the content is preferably from 1 to 45 mol %, more preferably from 5 to 40 mol %, still more preferably from 10 to 35 mol %, particularly preferably from 15 to 30 mol %.

The diol compounds having a logP value of 0 or more of (iv) may be used individually or in combination of two or more thereof but are preferably used individually in view of stability (sensitivity, press life or the like) of the printing plate.

(v) Another Amino Group-Containing Compound

In the polyurethane resin binder for use in the present invention, an amino group-containing compound represented by the following formula (31) or (32) may also be used in combination and reacted with the diisocyanate compound represented by formula (1) to form a urea structure and thereby incorporate the urea structure into the structure of the polyurethane resin.

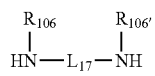

(31)

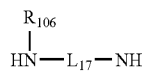

(32)

In the formulae, $R_{106}$ and $R_{106'}$ may be the same or different and each represents a hydrogen atom or an alkyl, aralkyl or aryl group which may have a substituent (examples of the substituent include an alkoxy group, a halogen atom (e.g., —F, —Cl, —Br, —I), an ester group and a carboxyl group), preferably a hydrogen atom, an alkyl group having from 1 to 8 carbon atoms which may have a carboxyl group as a substituent, or an aryl group having from 6 to 15 carbon atoms. $L_{17}$ represents a divalent aliphatic or aromatic hydrocarbon group or heterocyclic group, which may have a substituent (examples of the substituent include an alkyl group, an aralkyl group, an aryl group, an alkoxy group, an aryloxy group, a halogen atom (e.g., —F, —Cl, —Br, —I) and a carboxyl group). If desired, $L_{17}$ may contain another functional group which does not react with the isocyanate group, such as carbonyl group, ester group, urethane group and amido group. Two of $R_{106}$, $L_{17}$ and $R_{106'}$ may form a ring.

Specific examples of the compounds represented by formulae (31) and (32) include the followings:

aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2-6,6-tetramethylpiperidine, N,N-dimethylethylenediamine, lysine, L-cystine and isophoronediamine; aromatic diamine compounds such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis-(4-aminophenyl)sulfone, 4-carboxy-o-phenylenediamine, 3-carboxy-m-phenylenediamine, 4,4'-diaminophenyl ether and 1,8-naphthalenediamine; heterocyclic amine compounds such as 2-aminoimidazole, 3-aminotriazole, 5-amino-1H-tetrazole, 4-aminopyrazole, 2-aminobenzimidazole, 2-amino-5-carboxytriazole, 2,4-diamino-6-methyl-S-triazine, 2,6-diaminopyridine, L-histidine, DL-tryptophan and adenine; and aminoalcohol and aminophenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol and L-tyrosine.

The polyurethane resin of the present invention is synthesized by reacting the above-described isocyanate compound and diol compound under heating in an aprotic solvent in the presence of a known catalyst having an activity according to the reactivity of respective compounds. The total molar ratio of the diisocyanate compound (i) to the diol compound (in the case of containing (ii), (iii) and (iv) and further containing, if desired, (v) another amino group-containing compound component, the total molar ratio of the diisocyanate compound (i) to the compounds ((ii), (iii), (iv) and (v)) other than the diisocyanate) is preferably from 0.8:1 to 1.2:1. When the isocyanate group remains at the polymer terminal, the polymer is treated with an alcohol or an amine and thereby finally synthesized in the form of allowing for no remaining of the isocyanate group.

Out of polyurethane resins for use as an essential component in the photosensitive layer of the present invention, preferred is a polyurethane resin where the carboxyl group is contained in the range from 0.2 to 4.0 meq/g, preferably from 0.3 to 3.0 meq/g, more preferably from 0.4 to 2.0 meq/g, still more preferably from 0.5 to 1.5 meq/g, and most preferably from 0.6 to 1.2 meq/g.

The polyurethane resin binder for use in the present invention is particularly preferably a polyurethane resin binder having an acid value of 0.6 to 1.2 meq/g synthesized from the followings:

1. two or more diisocyanate compounds which are a combination of at least one aliphatic diisocyanate compound (when L is an aliphatic group) and at least one aromatic diisocyanate compound (when L is an aromatic group), 2. at least one diol compound having a carboxyl group, represented by formula (2), 3. at least one diol compound having a logP value of −5 to −1.2, and 4. at least one diol compound having a logP value of 3 to 10.

These polyurethane resins may be used individually or in combination.

The content of the polyurethane resin contained in the photosensitive composition for forming the photosensitive layer is from 10 to 90 mass %, preferably from 15 to 80 mass %, more preferably from 20 to 70 mass %, still more preferably from 25 to 60 mass %, and most preferably from 30 to 50 mass %.

i) More preferred specific examples of the polyurethane resin include the following compounds, but the present invention is not limited thereto. Most of the following specific compounds are shown by a combination of a diisocyanate compound and a diol compound used. Also, the carboxyl group content is shown as the acid value.

TABLE 1

Polyurethane Resin

|  | Diisocyanate Compound Used (mol %) | | Diol Compound Used (mol %) | | Acid Value (meq/g) |
|---|---|---|---|---|---|
| (1) | (i)-1 | (50) | (ii)-1 | (20) | 0.42 |
|  |  |  | (iii)-6 | (20) |  |
|  |  |  | (iv)-4 | (10) |  |
| (2) | (i)-2 | (50) | (ii)-2 | (10) | 0.56 |
|  |  |  | (iii)-1 | (15) |  |
|  |  |  | (iv)-9 | (25) |  |
| (3) | (i)-3 | (30) | (ii)-3 | (15) | 0.70 |
|  | (i)-5 | (20) | (iii)-3 | (15) |  |
|  |  |  | (iv)-1 | (20) |  |
| (4) | (i)-2 | (5) | (ii)-4 | (20) | 0.88 |
|  | (i)-6 | (45) | (iii)-2 | (20) |  |
|  |  |  | (iv)-11 | (5) |  |
|  |  |  | (v)-1 | (5) |  |
| (5) | (i)-1 | (40) | (ii)-1 | (40) | 1.49 |
|  | (i)-4 | (10) | (iii)-5 | (5) |  |
|  |  |  | (iv)-5 | (5) |  |
| (6) | (i)-2 | (25) | (ii)-3 | (30) | 0.93 |
|  | (i)-5 | (25) | (iii)-4 | (10) |  |
|  |  |  | (iv)-7 | (10) |  |
| (7) | (i)-1 | (40) | (ii)-1 | (25) | 0.90 |
|  | (i)-2 | (10) | (iii)-2 | (15) |  |
|  |  |  | (iv)-12 | (10) |  |
| (8) | (i)-5 | (25) | (ii)-1 | (35) | 1.84 |
|  | (i)-6 | (25) | (iii)-3 | (10) |  |
|  |  |  | (iv)-8 | (5) |  |
| (9) | (i)-2 | (10) | (ii)-1 | (40) | 2.46 |
|  | (i)-6 | (40) | (iii)-1 | (5) |  |
|  |  |  | (iv)-2 | (5) |  |

TABLE 2

|  | Diisocyanate Compound Used (mol %) | | Diol Compound Used (mol %) | | Acid Value (meq/g) |
|---|---|---|---|---|---|
| (10) | (i)-5 | (50) | (ii)-2 | (20) | 0.68 |
|  |  |  | (iii)16 | (10) |  |
|  |  |  | (iv)-13 | (10) |  |
|  |  |  | (v)-2 | (10) |  |
| (11) | (i)-1 | (40) | (ii)-1 | (40) | 1.40 |
|  | (i)-2 | (10) | (iii)-3 | (5) |  |
|  |  |  | (iv)-16 | (5) |  |

TABLE 2-continued

|  | Diisocyanate Compound Used (mol %) | | Diol Compound Used (mol %) | | Acid Value (meq/g) |
|---|---|---|---|---|---|
| (12) | (i)-1 | (40) | (ii)-1 | (20) | 0.32 |
|  | (i)-2 | (10) | (iii)-5 | (20) |  |
|  |  |  | (iv)-14 | (10) |  |
| (13) | (i)-1 | (40) | (ii)-1 | 25 | 0.62 |
|  | (i)-2 | (10) | (iii)-6 | (15) |  |
|  |  |  | (iv)-17 | (10) |  |
| (14) | (i)-1 | (40) | (ii)-4 | (35) | 1.08 |
|  | (i)-2 | (10) | (iii)-5 | (5) |  |
|  |  |  | (iv)-3 | (10) |  |
| (15) | (i)-1 | (40) | (ii)-1 | (30) | 0.86 |
|  | (i)-2 | (10) | (iii)-4 | (10) |  |
|  |  |  | (iv)-15 | (10) |  |
| (16) | (i)-1 | (40) | (ii)-1 | (25) | 1.42 |
|  | (i)-2 | (10) | (iii)-1 | (15) |  |
|  |  |  | (iv)-10 | (10) |  |
| (17) | (i)-1 | (40) | (ii)-1 | (10) | 0.89 |
|  | (i)-2 | (10) | (ii)-4 | (10) |  |
|  |  |  | (iii)-2 | (20) |  |
|  |  |  | (iv)-6 | (10) |  |
| (18) | (i)-1 | (40) | (ii)-1 | (20) | 0.74 |
|  | (i)-2 | (10) | (iii)-2 | (15) |  |
|  |  |  | (iii)-4 | (5) |  |
|  |  |  | (iv)-11 | (10) |  |

TABLE 3

|  | Diisocyanate Compound Used (mol %) | | Diol Compound Used (mol %) | | Acid Value (meq/g) |
|---|---|---|---|---|---|
| (19) | (i)-1 | (40) | (ii)-1 | (20) | 0.78 |
|  | (i)-2 | (10) | (iii)-2 | (15) |  |
|  |  |  | (iv)-4 | (10) |  |
|  |  |  | (iv)-15 | (5) |  |
| (20) | (i)-1 | (40) | (ii)-1 | (25) | 0.68 |
|  | (i)-2 | (10) | (iii)-5 | (10) |  |
|  |  |  | (iv)-6 | (15) |  |
| (21) | (i)-1 | (40) | (ii)-3 | (40) | 1.27 |
|  | (i)-2 | (10) | (iii)-3 | (5) |  |
|  |  |  | (iv)-12 | (5) |  |
| (22) | (i)-1 | (40) | (ii)-1 | (20) | 0.93 |
|  | (i)-2 | (10) | (iii)-2 | (10) |  |
|  |  |  | (iv)-9 | (20) |  |
| (23) | (i)-1 | (40) | (ii)-1 | (25) | 0.91 |
|  | (i)-2 | (10) | (iii)-5 | (5) |  |
|  |  |  | (iv)-7 | (20) |  |
| (24) | (i)-1 | (40) | (ii)-1 | (30) | 1.15 |
|  | (i)-2 | (10) | (iii)-1 | (10) |  |
|  |  |  | (iv)-12 | (10) |  |
| (25) | (i)-1 | (40) | (ii)-1 | (10) | 0.69 |
|  | (i)-2 | (10) | (ii)-2 | (10) |  |
|  |  |  | (iii)-2 | (10) |  |
|  |  |  | (iii)-3 | (10) |  |
|  |  |  | (iv)-12 | (10) |  |

(i) Diisocyanate Compound

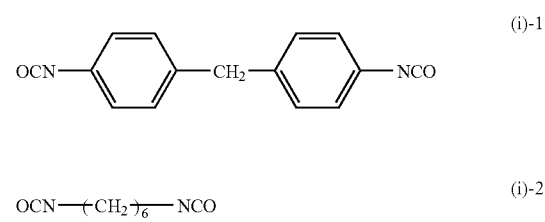

-continued (i)-3
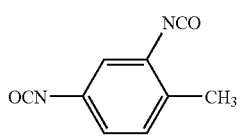

(i)-4
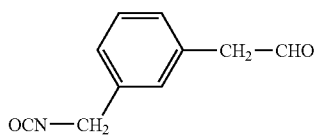

(i)-5
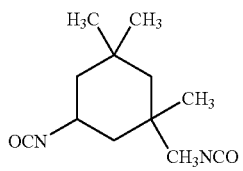

(i)-6
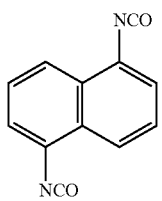

(ii) Diol Compound Having Carboxyl Group (ii)-1
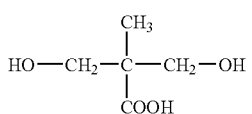

(ii)-2
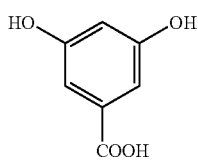

(ii)-3
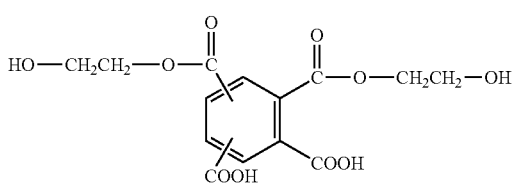

(ii)-4
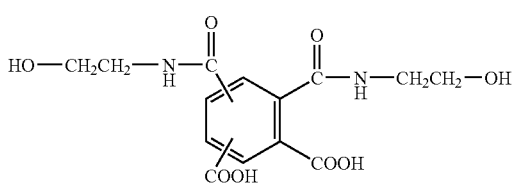

(iii) Diol Compound Having logP Value of Less than 0

|  |  | logP Value |
|---|---|---|
| n = 2 | (iii)-1 | −0.87 |
| n = 4 | (iii)-2 | −1.20 |
| polyethylene glycol having a number average molecular weight of 300 | (iii)-3 | −1.60 |
| polyethylene glycol having a number average molecular weight of 1,000 | (iii)-4 | −4.22 |
| polyethylene glycol having a number average molecular weight 2,000 | (iii)-5 | −7.97 |

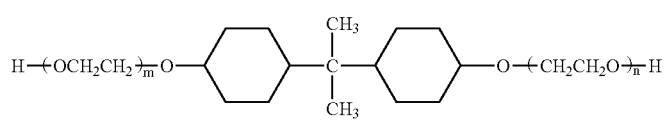

(iii)-6    −1.78

M + n = about 30
(hydroxyl group value: 72 mg KOH/g)

(iv) Diol Compound Having logP Value of 0 or More

| | logP Value |
|---|---|
| HO—(CH₂)₈—OH <br> (iv)-1 | 1.38 |
| HO—CH₂—C(CH₃)(CH₃)—CH₂—OH <br> (iv)-2 | 0.45 |
| HO—CH₂—⟨cyclohexyl⟩—CH₂—OH <br> (iv)-3 | 0.89 |
| HO—CH₂—⟨tricyclic⟩—CH₂OH <br> (iv)-4 | 1.20 |
| HO—CH₂—C(C₂H₈)(CH₂—O—CH₂CH=CH₂)—CH₂—OH <br> (iv)-5 | 0.86 |
| HO—⟨C₆H₄⟩—C(CH₃)(CH₃)—⟨C₆H₄⟩—OH <br> (iv)-6 | 4.32 |
| HO—CF₂CF₂—OH <br> (iv)-7 | 1.20 |
| HO—CH(CH₃)CH₂—O—C(=O)—CH=CH—C(=O)—O—CH₂CH(CH₃)—OH <br> (iv)-8 | 0.05 |
| HO—CH₂CH₂—O—C(=O)—⟨C₆H₄⟩—C(=O)—O—CH₂CH₂—OH <br> (iv)-9 | 0.62 |
| HO—CH₂CH₂—N(CH(CH₃)₂)—CH₂CH₂—OH <br> (iv)-10 | 0.03 |

-continued

| | logP Value |
|---|---|
| 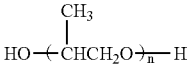 | |
| number average molecular weight: 425 (iv)-11 | 1.19 |
| number average molecular weight: 1,000 (iv)-12 | 3.65 |
|  | |
| number average molecular weight: 1,200 (iv)-13 (hydroxyl group value: 95 mgKOH/g) | 26.6 |
| 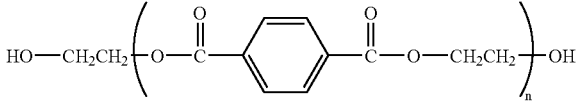 | |
| number average molecular weight: 850 (iv)-14 (hydroxyl group value: 135 mgKOH/g) | 4.61 |
| 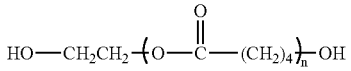 | |
| number average molecular weight: 1,000 (iv)-15 (hydroxyl group value: 112 mgKOH/g) | 3.08 |
| 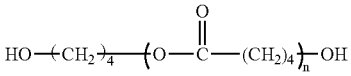 | |
| number average molecular weight: 2,000 (iv)-16 (hydroxyl group value: 56 mgKOH/g) | 7.49 |
| 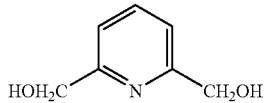 | 0.46 |
| (iv)-17 | |

(v) Another amino group-containing compound

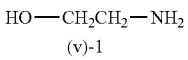
(v)-1

(v)-2

In the photosensitive layer of the photosensitive lithographic printing plate precursor for use in the present invention, another organic high molecular polymer having solubility in or swellability with alkali water may be further used in addition to the above-described polyurethane resin binder. As for the organic high molecular polymer, for example, when a water-soluble organic high molecular polymer is used, water development can be performed. Examples of such an organic high molecular polymer include addition polymers having a carboxylic acid group on the side chain, such as those described in JP-A-59-44615, JP-B-54-34327, JP-B-58-12577, JP-B-54-25957, JP-A-54-92723, JP-A-59-53836 and JP-A-59-71048, that is, methacrylic acid copolymer, acrylic acid copolymer, itaconic acid copolymer, crotonic acid copolymer, maleic acid copolymer and partially esterified maleic acid copolymer.

Other examples include acidic cellulose derivatives similarly having a carboxylic acid group on the side chain. In addition, compounds where a cyclic acid anhydride is added to an addition polymer having a hydroxyl group are useful. Among these, [benzyl(meth)acrylate/(meth)acrylic acid/if desired, another addition-polymerizable vinyl monomer] copolymers and [allyl(meth)acrylate/(meth)acrylic acid/if desired, another addition-polymerizable vinyl monomer] copolymers are preferred. Other than these, polyvinylpyrrolidone, polyethylene oxide and the like are useful as the water-soluble organic polymer. Also, in order to elevate the strength of the cured film, an alcohol-soluble polyamide, a polyether of 2,2-bis(4-hydroxyphenyl)-propane and epichlorohydrin, and the like are useful.

Furthermore, polyurethane resins described in JP-B-7-120040, JP-B-7-120041, JP-B-7-120042, JP-B-8-12424, JP-A-63-287944, JP-A-63-287947, JP-A-1-271741 and JP-A-11-352691 are useful for usage in the present invention.

When a radical reactive group is introduced into the side chain of such a high molecular polymer, the strength of the cured film can be increased. Examples of the functional group capable of addition-polymerization reaction include an ethylenically unsaturated bond group, an amino group and an epoxy group; examples of the functional group capable of becoming a radical upon irradiation of light include a mercapto group, a thiol group, a halogen atom, a triazine structure and an onium salt structure; and examples of the polar group include a carboxyl group and an imide group. In particular, the functional group capable of addition-polymerization reaction is preferably an ethylenically unsaturated group such as acryl group, methacryl group, allyl group and styryl group, but a functional group selected from an amino group, a hydroxy group, a phosphonic acid group, a phosphoric acid group, a carbamoyl group, an isocyanate group a ureido group, a ureylene group, a sulfonic acid group and an ammonio group is also useful.

In order to impart good developability and press life, the polyurethane resin binder used in the present invention preferably has an appropriate molecular weight and an appropriate acid value. The molecular weight and acid value are appropriately adjusted according to the pH or composition of the developer, the performance required of the printing plate, or the like, but the molecular weight in terms of polystyrene as measured by the GPC method is from 5,000 to 500,000, preferably from 10,000 to 30,000, more preferably from 20,000 to 150,000. With a molecular weight of 5,000 or more, the press life is satisfied and with a molecular weight of 500,000 or less, good developability is obtained. The acid value is from 0.2 to 4.0 meq/g, preferably from 0.3 to 3.0 meq/g, more preferably from 0.4 to 2.0 meq/g, still more preferably from 0.5 to 1.5 meq/g, and most preferably from 0.6 to 1.2 meq/g. With an acid value of 0.2 meq/g or more, good developability is obtained and with an acid value of 6.0 meq/g or less, the press life is satisfied.

[Acid Value of Photosensitive Layer]

The acid value of photosensitive layer as used in the present invention is an equivalent of an acid having a pKa of 9 or less contained per g of the photosensitive composition layer provided on a support of a photosensitive lithographic printing plate (lithographic printing plate precursor) (excluding an overcoat layer such as oxygen-shielding layer provided on the photosensitive layer). The acid value may be experimentally determined by directly titrating the photosensitive layer with an aqueous sodium hydroxide solution but can also be determined by calculation from the content of the compound having an acid group with a pKa of 9 or less in the photosensitive composition.

As for the specific method of changing the acid value of the photosensitive layer, it may be considered to change the content ratio of a crosslinking agent monomer to a binder polymer (linear polymer) having an acid group, which are photosensitive layer components, or use a binder polymer with low acid value having less acid group.

The binder polymer with low acid value is used in the range from 0.2 to 4.0 meq/g, preferably from 0.3 to 3.0 meq/g, more preferably from 0.4 to 2.0 meq/g, still more preferably from 0.5 to 1.5 meq/g, and most preferably from 0.6 to 1.2 meq/g.

In the present invention, the acid value of the photosensitive layer is preferably 1.0 meq/g or less. It is effective to apply the present invention to a lithographic printing plate having a photosensitive layer with an acid value of 0.20 to 0.60 meq/g, preferably from 0.30 to 0.50 meq/g in view of image forming property.

Such an organic high molecular polymer can be mixed in an arbitrary amount in the entire photosensitive composition. However, if the amount exceeds 90 mass %, an undesirable effect results in view of strength or the like of the image formed. The amount is preferably 10 to 90%, more preferably from 30 to 80%. Also, the ratio by mass of the photopolymerizable ethylenically unsaturated compound to the organic high molecular polymer is preferably from 1/9 to 9/1, more preferably from 2/8 to 8/2, still more preferably from 3/7 to 7/3. There, the "organic high molecular polymer" includes the polyurethane resin binder of the present invention.

[F. Other Components]

In the photosensitive layer of the present invention, other components suitable for its use, production method and the like can be appropriately added. Preferred additives are described below.

(D1) Co-Sensitizer

The sensitivity can be further improved by using a certain kind of additive (hereinafter referred to as a "co-sensitizer"). The operation mechanism thereof is not clearly known but is considered to mostly rely on the following chemical process. That is, it is presumed that the co-sensitizer reacts with various intermediate active species (e.g., radical, peroxide, oxidant, reductant) generated in the process of photoreaction initiated by the light absorption of the above-described initiation system and subsequent addition polymerization reaction, whereby a new active radical is produced. These compounds can be roughly classified into (a) those which produce an active radical by undergoing reduction, (b) those which produce an active radical by undergoing oxidation, and (c) those which react with a low-activity radical to convert it into a more highly active radical or which act as a chain transfer agent. However, to which class individual compounds belong is not commonly accepted in many cases.

(a) Compounds which Produce Active Radical by Undergoing Reduction

Compound Having Carbon-Halogen Bond:

This compound is considered to generate an active radical resulting from reductive cleavage of carbon-halogen bond. Specific examples of the compound which can be suitably used include trihalomethyl-s-triazines and trihalomethyloxadiazoles.

Compound Having Nitrogen-Nitrogen Bond:

This compound is considered to generate an active radical resulting from reductive cleavage of nitrogen-nitrogen bond. Specific examples of the compound which can be suitably used include hexaarylbiimidazoles.

Compound Having Oxygen-Oxygen Bond:

This compound is considered to generate an active radical resulting from reductive cleavage of oxygen-oxygen bond. Specific examples of the compound which can be suitably used include organic peroxides.

Onium Compound:

This compound is considered to generate an active radical resulting from reductive cleavage of carbon-hetero bond or oxygen-nitrogen bond. Specific examples of the compound which can be suitably used include diaryliodonium salts, triarylsulfonium salts and N-alkoxypyridinium (azinium) salts.

Ferrocene and Iron Allene Complexes:

These compounds can reductively produce an active radical.

(b) Compound which Produces Active Radical by Undergoing Oxidation

Alkylate Complex:

This compound is considered to produce an active radical resulting from oxidative cleavage of carbon-hetero bond. Specific examples of the complex which can be suitably used include triaryl alkylborates.

Alkylamine Compound:

This compound is considered to produce an active radical resulting from cleavage of C—X bond on the carbon adjacent to nitrogen upon oxidation. Preferred examples of X include a hydrogen atom, a carboxyl group, a trimethylsilyl group and a benzyl group. Specific examples thereof include ethanolamines, N-phenylglycines and N-trimethylsilylmethylamines.

Sulfur- or Tin-Containing Compound:

A compound in which the nitrogen atom of the above-described amines is replaced by a sulfur or tin atom can produce an active radical by the same action. Also, a compound having an S—S bond is known to effect sensitization resulting from S—S cleavage.

α-Substituted Methylcarbonyl Compound:

This compound can produce an active radical resulting from cleavage of carbonyl-α carbon bond upon oxidation. A compound in which the carbonyl is converted into an oxime ether also exhibits the same action. Specific examples thereof include 2-alkyl-1-[4-(alkylthio)phenyl]-2-morpholinopulonone-1 compounds, and oxime ethers obtained by reacting these compounds with hydroxyamines and then etherifying N—OH.

Sulfinic Acid Salts:

These compounds can reductively produce an active radical. Specific examples thereof include sodium arylsulfinate.

(c) Compound Which Reacts with Radical to Convert It into More Highly Active Radical or which Acts as Chain Transfer agent:

For example, compounds having SH, PH, SiH or GeH within the molecule can be used. These compounds can produce a radical by donating hydrogen to a low-activity radical species or can produce a radical through oxidation and then deprotonation. Specific examples thereof include 2-mercaptobenzimidazoles.

As for more specific examples of such co-sensitizers, many compounds are described, for example, in JP-A-9-236913 as an additive used for the purpose of improving sensitivity. Some of these compounds are set forth below, but the present invention is not limited thereto. In the following compounds, -TMS represents a trimethylsilyl group.

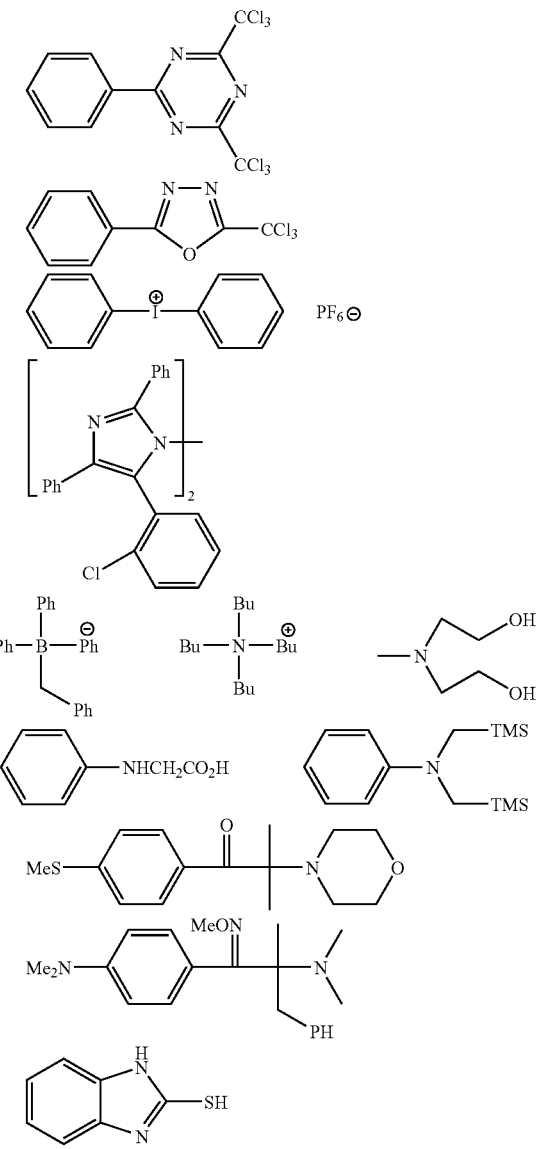

These co-sensitizers can also be further subjected to various chemical modifications so as to improve the properties of the photosensitive layer, similarly to the fluorescent brightening agent described above. Examples of the method which can be used therefor include bonding with the fluorescent brightening agent, activator, addition-polymerizable unsaturated compound or other part, introduction of a hydrophilic moiety, enhancement of compatibility, introduction of a substituent for preventing crystal deposition or improving adhesion, and formation into a polymer.

These co-sensitizers can be used individually or in combination of two or more thereof. The amount of the co-sensitizer used is from 0.05 to 100 parts by mass, preferably from 1 to 80 parts by mass, more preferably from 3 to 50 parts by mass, per 100 parts by mass of the compound having an ethylenically unsaturated double bond.

(D2) Polymerization Inhibitor

In the present invention, a small amount of a thermal polymerization inhibitor is preferably added in addition to the above-described basic components so that the polymerizable compound having an ethylenically unsaturated double bond can be prevented from unnecessary thermal polymerization during production or storage of the photosensitive composition. Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitrosophenylhydroxyamine cerous salt. The amount of the thermal polymerization inhibitor added is preferably from about 0.01 to about 5 mass % based on the mass of the entire composition. If desired, in order to prevent polymerization inhibition by oxygen, a higher fatty acid derivative such as behenic acid and behenic acid amide may be added and allowed to localize on the photosensitive layer surface during drying after the coating. The amount of the higher fatty acid derivative added is preferably from about 0.5 to about 10 mass % based on the entire composition.

(D3) Coloring Agent, Etc.

Furthermore, a dye or pigment may be added for the purpose of coloring the photosensitive layer. By this addition, so-called suitability for plate inspection of the printing plate, such as visibility after plate making or aptitude for image densitometer, can be enhanced. In particular, the coloring agent is preferably a pigment, because many dyes cause reduction in the sensitivity of the photopolymerization-system photosensitive layer. Specific examples of the coloring agent include pigments such as phthalocyanine-based pigment, azo-based pigment, carbon black and titanium oxide, and dyes such as ethyl violet, crystal violet, azo-based dye, anthraquinone-based dye and cyanine-based dye. The amount of the dye or pigment added is preferably from about 0.5 to about 5 mass % based on the entire composition.

(D4) Other Additives

Other known additives may be further added, such as inorganic filler or plasticizer for improving the physical properties of the cured film, and ink receptivity agent capable of enhancing the inking property on the photosensitive layer surface.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin, and when a binder is used, the plasticizer may be added in an amount of 10 mass % or less based on the total mass of the compound having an ethylenically unsaturated double bond and the binder.

In addition, UV initiator, heat crosslinking agent and the like may also be added so as to strengthen the effect of heating/exposure performed after development for the purpose of enhancing the film strength (press life) which is described later.

Other than these additives, an additive or interlayer for enhancing the adhesion of the photosensitive layer to a support or elevating the removability of unexposed photosensitive layer by development may be added or provided. For example, when a compound showing relatively strong interaction with the substrate, such as compound having diazonium structure and phosphone compound, is added or undercoated, the adhesion and press life can be enhanced. On the other hand, when a hydrophilic polymer such as polyacrylic acid and polysulfonic acid is added or undercoated, the developability of non-image area and in turn the scumming resistance can be enhanced.

The photosensitive composition for use in the present invention is dissolved in various organic solvents at the time of coating it on a support. Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid content concentration in the coating solution is suitably from 2 to 50 mass %.

The coverage of the photosensitive layer on the support has an effect mainly on the sensitivity and developability of the photosensitive layer and on the strength and press life of the exposed film. Therefore, an appropriate coverage is preferably selected according to use. If the coverage is too small, the press life is insufficient, whereas if it is excessively large, this is disadvantageous in that the sensitivity decreases, the exposure takes much time and the development also requires a longer time. In the case of a lithographic printing plate for scan exposure, which is a main object of the present invention, the coverage of the photosensitive layer is suitably from about 0.1 to about 10 g/m$^2$, more preferably from 0.5 to 5 g/m$^2$, in terms of the mass after drying.

[E. Support]

In order to obtain a lithographic printing plate which is one of the main objects of the present invention, the photosensitive layer is preferably provided on a support having a hydrophilic surface. As for the hydrophilic support, conventionally known hydrophilic supports used for lithographic printing plates can be used without limitation. This support is preferably a dimensionally stable plate-like material and examples thereof include paper, paper laminated with plastic (e.g., polyethylene, polypropylene, polystyrene), metal sheet (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or vapor-deposited with such a metal. If desired, the surface of this support may be subjected to a known appropriate physical or chemical treatment so as to, for example, impart hydrophilicity or enhance the strength.

Among those supports, preferred are paper, polyester film and aluminum plate, and more preferred is aluminum plate because this is dimensionally stable and relatively inexpensive and can provide a surface excellent in the hydrophilicity and strength through a surface treatment as needed. Also, a composite sheet obtained by bonding an aluminum sheet on a polyethylene terephthalate film described in JP-B-48-18327 may be preferably used.

The aluminum plate is preferably a pure aluminum plate or an alloy plate mainly comprising aluminum and containing trace heteroelements or may be a plastic film laminated or vapor-deposited with aluminum. Examples of the heteroelement contained in the aluminum alloy include silicon, iron, manganese, copper, magnesium, chromium, zinc, bismuth, nickel and titanium. The heteroelement content in the alloy is 10 mass % or less at most. In the present invention, the aluminum is preferably pure aluminum, but perfectly pure aluminum is difficult to produce in view of refining technique and therefore, aluminum containing trace heteroelements may be used. In this way, the composition of the aluminum plate for use in the present invention is not particularly specified, and an aluminum plate formed of a conventionally known and commonly employed material can be appropriately used. The thickness of the aluminum plate for use in the present invention is approximately from 0.1 to 0.6 mm, preferably from 0.15 to 0.4 mm, more preferably from 0.2 to 0.3 mm.

In the case of a support having a metal surface, particularly an aluminum surface, the support is preferably subjected to a surface treatment such as surface roughening (graining), dipping in an aqueous solution of sodium silicate, potassium fluorozirconate, phosphate or the like, and anodization.

The surface roughening treatment for the aluminum plate surface can be performed by various methods but, for example, this is performed by a method of mechanically roughening the surface, a method of electrochemically dissolving and roughening the surface, or a method of chemically and selectively dissolving the surface. Examples of the mechanical method which can be used include known methods such as ball polishing, brush polishing, blast polishing and buff polishing. Examples of the electrochemical surface roughening method include a method of applying an alternating or direct current in an electrolytic solution of hydrochloric acid, nitric acid or the like. A method combining these two treatments disclosed in JP-A-54-63902 can also be used. Before surface-roughening the aluminum plate, a degreasing treatment for removing the rolling oil on the surface is performed, if desired, by using a surfactant, an organic solvent, an alkaline aqueous solution or the like.

Also, an aluminum plate which is surface-roughened and then subjected to dipping in an aqueous sodium silicate solution can be suitably used. An aluminum plate subjected to anodization and then to dipping in an aqueous alkali metal silicate solution described in JP-B-47-5125 is preferred. The anodization treatment is performed, for example, by applying a current while using the aluminum plate as the anode in an electrolytic solution where aqueous or non-aqueous solutions of an inorganic acid such as phosphoric acid, chromic acid, sulfuric acid and boric acid, an organic acid such as oxalic acid and sulfamic acid, or a salt thereof are used individually or in combination of two or more thereof.

Silicate electrodeposition described in U.S. Pat. No. 3,658,662 is also effective.

In addition, a surface treatment combining a support subjected to electrolytic graining disclosed in JP-B-46-27481, JP-A-52-58602 and JP-A-52-30503 with the above-described anodization treatment and sodium silicate treatment is also useful.

Furthermore, a support disclosed in JP-A-56-28893, which is sequentially subjected to mechanical roughening, chemical etching, electrolytic graining, anodization and sodium silicate treatment, is preferred.

It is also preferred to undercoat the thus-treated support with a water-soluble resin such as polyvinyl phosphonate, polymer or copolymer having a sulfonic acid group on the side chain, polyacrylic acid, water-soluble metal salt (e.g., zinc borate), yellow dye and amine salt.

A sol-gel-treated substrate obtained by covalently bonding a functional group capable of causing an addition reaction under the action of a radical disclosed in JP-A-7-154983 is also preferred.

Other preferred examples include those where a water-resistant hydrophilic layer is provided as a surface layer on an arbitrary support. Examples of such a surface layer include a layer comprising an inorganic pigment and a binder described in U.S. Pat. No. 3,055,295 and JP-A-56-13168, a hydrophilic swelling layer described in JP-A-9-80744, and a sol-gel film comprising titanium oxide, polyvinyl alcohol and silicic acids described in JP-T-8-507727 (the term "JP-T" as used herein means a "published Japanese translation of a PCT patent application").

Such a hydrophilization treatment is performed not only to render the support surface hydrophilic but also, for example, to prevent undesirable reactions of the photopolymerizable composition provided thereon and enhance the adhesive property of the photosensitive layer.

[F. Protective Layer]

In the lithographic printing plate for scan exposure, which is a preferred embodiment of the present invention, a protective layer is preferably further provided on the photopolymerizable composition layer, because the exposure is usually performed in air. The protective layer prevents low molecular compounds such as oxygen and basic substance present in air, which inhibit the image-formation reaction occurring in the photosensitive layer upon exposure, from mixing into the photosensitive layer and thereby enables exposure in air. Accordingly, the properties required of this protective layer are to have low permeability to low molecular compounds such as oxygen, substantially not inhibit transmission of light used for exposure, exhibit excellent adhesion to the photosensitive layer and be easily removable in the development step after exposure. Various designs have been conventionally made on such a protective layer and these are described in detail in U.S. Pat. No. 3,458,311 and JP-B-55-49729. The material which can be used for the protective layer is, for example, preferably a water-soluble polymer compound having relatively excellent crystallinity. Specifically, water-soluble polymers such as polyvinyl alcohol, polyvinyl-pyrrolidone, acidic celluloses, gelatin, gum arabic and polyacrylic acid are known. Among these, polyvinyl alcohol is preferably used as the main component, because most advantageous results are obtained in view of fundamental properties such as oxygen blocking property and removability by development.

The polyvinyl alcohol for use in the protective layer may be partially displaced by an ester, an ether or an acetal as long as it contains an unsubstituted vinyl alcohol unit necessary for ensuring oxygen blocking property and water solubility. Similarly, the polyvinyl alcohol may have another copolymerization component in a partial portion. Examples of the polyvinyl alcohol include those having a hydrolysis degree of 71 to 100% and a molecular weight of 300 to 2,400 in terms of the weight average molecular weight. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components (e.g., selection of PVA, use of additives), coated amount and the like of the protective layer are selected by taking account of fogging, adhesion and scratch resistance in addition to oxygen blocking property and removability by development. In general, as the PVA used has a higher hydrolysis ratio (namely, the protective layer has a higher content of unsubstituted vinyl alcohol unit) and the layer thickness is larger, the oxygen blocking property is more intensified and this is more advantageous in view of sensitivity. However, if the oxygen blocking property is extremely intensified, an unnecessary polymerization reaction occurs during production or stock storage, or problems such as unnecessary fogging or thickening of image line are caused at the image exposure. The adhesion to the image area and the scratch resistance are also very important in view of handling of the printing plate. The method for coating such a protective layer is described in detail, for example, in U.S. Pat. No. 3,458,311 and JP-A-55-49729.

Other functions can also be imparted to the protective layer. For example, when a coloring agent (e.g., water-soluble dye) ensuring excellent transmission of light at 350 nm to 450 nm used for exposure and being capable of efficiently absorbing light at 500 nm or more is added, the aptitude for safelight can be enhanced without causing decrease of sensitivity.

[G. Image-Forming Method and Plate-Making Process]

In the case where a photosensitive material using the photosensitive composition of the present invention is used as an image-forming material, an image is generally obtained by performing image exposure and then removing the unexposed area of the photosensitive layer with a developer. When a lithographic printing plate is prepared by using such a photosensitive composition, preferred examples of the developer used therefor include those described in JP-B-57-7427. The developer is suitably an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia, or an organic alkali agent such as monoethanolamine and diethanolamine. Such an alkali solution is added to have a concentration of 0.1 to 10 mass %, preferably from 0.5 to 5 mass %.

If desired, such an alkaline aqueous solution may contain a small amount of a surfactant or an organic solvent such as benzyl alcohol, 2-phenoxyethanol and 2-butoxyethanol. Examples thereof include those described in U.S. Pat. Nos. 3,375,171 and 3,615,480.

Furthermore, developers described in JP-A-50-26601, JP-A-58-54341, JP-B-56-39464 and JP-B-56-42860 are also excellent.

In particular, the developer is preferably a developer containing a nonionic compound represented by the following formula (IV) and having a pH of 11.5 to 12.8 and an electric conductivity of 3 to 30 mS/cm described in JP-A-2002-202616.

$$A-W \quad\quad (IV)$$

wherein A represents a hydrophobic organic group having logP of 1.5 or more as A-H, and W represents a nonionic hydrophilic organic group having logP value of less than 1.0 as W-H.

The logP value is generally used as a hydrophobicity parameter which is described in C. Hansch and A. Leo, *Substituent Constants for Correlation Analysis in Chemistry and Biology*, J. Wile & Sons (1979). The logP value is defined as a logarithm of an equilibrium concentration ratio P calculated from the proportion of objective molecules (A-H and W-H) distributed to each layer of an octanol/water two-layer system.

The logP value is used here as an index for specifying each group of A and W in formula (I) and for the convenience's sake, assuming that an A-H or W-H structure is formed by bonding a hydrogen atom to each organic group A or W, the logP value is determined by calculation from known data according to the method described in A. K. Ghose, et al., *J. Comput. Chem.*, 9, 80 (1988).

This developer component is described in detail in JP-A-2002-202616 (paragraphs (0024) to (0067)).

In the present invention, it is effective to add the nonionic compound represented by formula (IV) in an amount of 0.1 to 15 mass %, preferably from 1.0 to 8.0 mass %, in the developer.

Other than those described above, in the plate-making process of the lithographic printing plate of the present invention, the entire surface may be heated, if desired, before or during the exposure or between the exposure and the development. This heating is advantageous in that the image formation reaction in the photosensitive layer is accelerated, the sensitivity and press life are enhanced, and the sensitivity is stabilized. Furthermore, for the purpose of improving the image strength and press life, it is also effective to subject the entire surface of the developed image to post-heating or exposure. Usually, the heating before the development is preferably performed under a mild condition of 150° C. or less. When the heating temperature is 150° C. or less, the problem of fogging in the non-image area does not arise. The heating after the development uses a very severe condition of usually from 200 to 500° C. When the temperature is 200° C. or more, a sufficiently high effect of strengthening the image is obtained and when the temperature is 500° C. or less, there arises no problem such as deterioration of support or thermal decomposition of image area.

As for the method of exposing the lithographic printing plate for scan exposure of the present invention, known methods can be used without limitation. The wavelength of light source is preferably from 350 to 450 nm, and specifically, an InGaN semiconductor laser is preferred. The exposure mechanism may be any of internal drum system, external drum system and flat bed system. In addition, the photosensitive layer components of the present invention can be made soluble in neutral or alkalescent water by using highly water-soluble components, and a lithographic printing plate having such a construction can be processed by a system of loading the plate on a printing press and then performing exposure-development on the press.

The laser light source of 350 to 450 nm which is available and usable includes the followings.

The gas laser includes an Ar ion laser (364 nm, 351 nm, from 10 mW to 1 W), a Kr ion laser (356 nm, 351 nm, from 10 mW to 1 W) and a He—Cd laser (441 nm, 325 nm, from 1 to 100 mW).

The solid laser includes a combination of Nd:YAG (YVO$_4$) with SHG crystal×2 times (355 nm, from 5 mW to 1 W), and a combination of Cr:LiSAF with SHG crystal (430 nm, 10 mW).

The semiconductor laser system includes a KNbO$_3$ ring resonator (430 nm, 30 mW), a combination of wave guide-type wavelength conversion element with AlGaAs or InGaAs semiconductor (from 380 to 450 nm, from 5 to 100 mW), a combination of wave guide-type wavelength conversion element with AlGaInP or AlGaAs semiconductor (from 300 to 350 nm, from 5 to 100 mW), and AlGaInN (from 350 to 450 nm, from 5 to 30 mW).

The pulse laser includes an N$_2$ laser (337 nm, pulse: from 0.1 to 10 mJ), and XeF (351 nm, pulse: from 10 to 250 mJ).

Among these light sources, an AlGaInN semiconductor laser (commercially available InGaN system semiconductor laser, from 400 to 410 nm, from 5 to 30 mW) is preferred in view of wavelength properties and cost.

As for the exposure apparatus using a scan exposure system for lithographic printing plates, the exposure mechanism includes an internal drum system, an external drum system and a flat bed system, and all of the above-described light sources excluding pulse lasers can be used as the light source. In practice, the following exposure devices are particularly preferred in view of relationship between the sensitivity of photosensitive material and the plate-making time:

a single beam exposure apparatus employing an internal drum system and using one gas or solid laser light source, a multi-beam exposure apparatus employing a flat bed system and using a number (10 or more) of semiconductor lasers, and a multi-beam exposure apparatus employing an external drum system and using a number (10 or more) of semiconductor lasers.

In the above-described laser direct drawing-type lithographic printing plate, the following equation (eq 1) is generally established among sensitivity X (J/cm$^2$) of photosensitive material, exposure area S (cm$^2$) of photosensitive material, power q (W) of one laser light source, number n of lasers, and entire exposure time t (s):

$$X \cdot S = n \cdot q \cdot t \quad \text{(eq 1)}$$

i) In the case of an internal drum (single beam) system, the following equation (eq 2) is generally established among rotation number f (radian/s) of laser, sub-scanning length Lx (cm) of photosensitive material, resolution Z (dot/cm), and entire exposure time t (s):

$$f \cdot Z \cdot t = Lx \quad \text{(eq 2)}$$

ii) In the case of an external drum (multi-beam) system, the following equation (eq 3) is generally established among rotation number F (radian/s) of drum, sub-scanning length Lx (cm) of photosensitive material, resolution Z (dot/cm), entire exposure time t (s), and number (n) of beams:

$$F \cdot Z \cdot n \cdot t = Lx \quad \text{(eq 3)}$$

iii) In the case of a flat bed (multi-beam) system, the following equation (eq 4) is generally established among rotation number H (radian/s) of polygon mirror, sub-scanning length Lx (cm) of photosensitive material, resolution Z (dot/cm), entire exposure time t (s), and number (n) of beams:

$$H \cdot Z \cdot n \cdot t = Lx \quad \text{(eq 4)}$$

When the resolution (2,560 dpi) required of the actual printing plate, the plate size (A1/B1, sub-scanning length: 42 inch), the exposure condition of about 20 plates/hour and the photosensitive properties (photosensitive wavelength, sensitivity: about 0.1 mJ/cm$^2$) of the photosensitive composition for use in the present invention are substituted to the above-described equations, it can be understood that a combination of the photosensitive material of the present invention with a semiconductor laser multi-beam exposure system is preferred. Furthermore, when the operability, cost and the like are also taken account of, a combination with a semiconductor laser multi-beam exposure apparatus employing an external drum system is most preferred.

Other examples of the exposure light source which can be used for the photosensitive composition of the present invention include an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, various visible or ultraviolet laser lamps, a fluorescent lamp, a tungsten lamp and sunlight. The photosensitive composition of the present invention can be widely applied without limitation to those known as uses of photocurable resin, in addition to the lithographic printing plate for scan exposure. For example, when the photosensitive composition of the present invention is applied to a liquid photosensitive composition using, if desired, a cation polymerizable compound in combination, a high-sensitivity material for stereolithography can be obtained. Also, a hologram material may be provided by utilizing the change in the refractive index resulting from photopolymerization. Furthermore, application to various transfer materials (e.g., peelable photosensitive material, toner developable photosensitive material) may be realized by utilizing the change in the surface viscosity resulting from photopolymerization. In addition, the photosensitive composition of the present invention can be applied to photocuring of a microcapsule, production of an electric material such as photoresist, or photocurable resin materials such as ink, paint and adhesive.

EXAMPLES

The present invention is described below by referring to Examples and Comparative Examples, but the present invention should not be construed as being limited thereto.

Examples 1 to 12 and Comparative Examples 1 to 3

(Preparation of Support)

A 0.3 mm-thick aluminum plate was etched by dipping it in 10 mass % sodium hydroxide at 60° C. for 25 seconds, washed with running water, neutralization-washed with 20 mass % nitric acid and then washed with water. The resulting plate was subjected to electrolytic surface roughening in an aqueous 1 mass % nitric acid solution by using a sinusoidal alternating waveform current with an anode time electricity of 300 Coulomb/dm$^2$. Subsequently, the plate was dipped in an aqueous 1 mass % sodium hydroxide solution at 40° C. for 5 seconds, desmutted at 60° C. for 40 seconds by dipping it in an aqueous 30 mass % sulfuric acid solution, and then anodized in an aqueous 20 mass % sulfuric acid solution at a current density of 2 A/dm$^2$ for 2 minutes to form an anodic oxide film having a thickness of 2.7 g/m$^2$. The surface roughness was measured and found to be 0.3 μm (Ra indication according to JIS B0601).

On the back surface of the thus-treated substrate, the following sol-gel reaction solution was coated by a bar coater and dried at 100° C. for 1 minute to prepare a support having provided thereon a backcoat layer having a dry coated amount of 70 mg/M$^2$.

Sol-Gel Reaction Solution:

| | |
|---|---|
| Tetraethyl silicate | 50 parts by mass |
| Water | 20 parts by mass |
| Methanol | 15 parts by mass |
| Phosphoric acid | 0.05 parts by mass |

The components shown above were mixed and stirred, then, heat generation was initiated within about 5 minutes. After allowing the reaction to proceed for 60 minutes, the following solution was added to prepare a coating solution for the backcoat layer.

| | |
|---|---|
| Pyrogallol-formaldehyde condensed resin (molecular weight: 2,000) | 4 parts by mass |
| Dimethyl phthalate | 5 parts by mass |
| Fluorine-containing surfactant (N-butylperfluorooctanesulfonamidoethyl acrylate/polyoxyethylene acrylate copolymer, molecular weight: 20,000) | 0.7 parts by mass |
| Methanol silica sol (produced by Nissan Chemical Industry, Ltd., methanol: 30 mass %) | 50 parts by mass |
| Methanol | 800 parts by mass |

(Preparation of Photosensitive Layer)

On the thus-processed aluminum plate, a photosensitive composition having the following composition was coated to have a dry coated amount of 1.0 to 2.0 $g/m^2$, and dried at 80° C. for 2 minutes to form a photosensitive layer.

| | |
|---|---|
| Addition-polymerizable compound shown below | 1.6 g |
| Polyurethane resin binder (shown in Table 2) | W g |
| Photopolymerization initiation system | |
| Fluorescent brightening agent (shown in Table 2) | X g |
| Activator (shown in Table 2) | Y g |
| Co-sensitizer (2-mercaptobenzoxazole) | 0.20 g |
| Fluorine-containing nonionic surfactant (Megafac F-780F, produced by Dai-Nippon Ink & Chemicals, Inc.) | 0.03 g |
| Thermal polymerization inhibitor: N-nitrosophenylhydroxylamine aluminum salt | 0.01 g |
| Pigment dispersion | 2.0 g |
| Composition of pigment dispersion: | |
| Pigment Blue 15:6 | 15 parts by mass |
| Allyl methacrylate/methacrylic acid copolymer (copolymerization molar ratio: 83/17) | 10 parts by mass |
| Cyclohexanone | 15 parts by mass |
| Methoxypropyl acetate | 20 parts by mass |
| Propylene glycol monomethyl ether | 40 parts by mass |
| Methyl ethyl ketone | 20 g |
| Propylene glycol monomethyl ether | 20 g |

Addition-Polymerizable Compound:

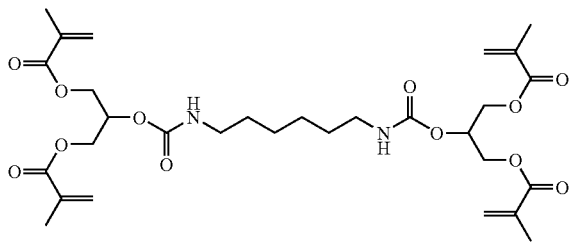

(Preparation of Protective Layer)

On the thus-formed photosensitive layer, an aqueous 3 mass % polyvinyl alcohol (saponification degree: 98 mol %, polymerization degree: 550) solution was coated to have a dry coated mass of 2 $g/m^2$ and dried at 100° C. for 2 minutes.

(Evaluation of Sensitivity)

On the thus-obtained photosensitive material, Fuji Step Guide (a gray scale discontinuously changed in the transmission optical density by ΔD=0.15) manufactured by Fuji Photo Film Co., Ltd. was tightly contacted. Thereafter, the photosensitive material was exposed to a xenon lamp through an optical filter to give a known exposure energy, and then developed at 25° C. for 10 seconds by dipping it in a developer having the following composition. The highest step number where the image was completely removed was read, the exposure energy level thereof was determined, and the sensitivity was calculated therefrom (unit: $mJ/cm^2$). As the energy level is smaller, the sensitivity is higher. For the purpose of estimating the suitability for exposure to a short-wave semiconductor laser, exposure was performed with monochromic light of 400 nm by using Kenko BP-40 as an optical filter. The results are shown in Table 2. Specific examples of the polyurethane resin used in the present invention are set forth in Table 1 below.

TABLE 1

Table 1 (Polyurethane Resin Binder of the Invention)

| Name of Polyurethane Resin Binder | Polyurethane Compound Shown in Specific Examples | Weight Average Molecular Weight (in terms of polystyrene by GPC) |
|---|---|---|
| B-1 | (1) | 41,000 |
| B-2 | (4) | 78,000 |
| B-3 | (6) | 55,000 |
| B-4 | (7) | 61,000 |
| B-5 | (9) | 205,000 |
| B-6 | (11) | 110,000 |
| B-7 | (12) | 9,000 |
| B-8 | (13) | 32,000 |
| B-9 | (18) | 48,000 |
| B-10 | (19) | 77,000 |

(Composition of Developer)

An aqueous solution at a pH of 12.0 having the following composition.

| | |
|---|---|
| Potassium hydroxide | 0.2 g |
| 1K Potassium silicate ($SiO_2/K_2O$ = 1.9) | 2.4 g |
| Compound of formula 1 below | 5.0 g |
| Ethylenediaminetetraacetic acid.4 Na salt | 0.1 g |
| Water | 91.3 g |

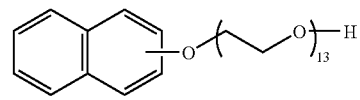

(Formula I)

TABLE 2

| | Photoinitiation System | | | |
|---|---|---|---|---|
| | Fluorescent Brightening Agent (X g) | Activator Compound (Y g) | Polyurethane Resin Binder (W g) | Clear Sensitivity (mJ/cm$^2$) |
| Example 1 | D-1 (0.20) | A-1 (0.35) | B-1 (1.50) | 0.10 |
| Example 2 | D-1 (0.20) | A-2 (0.20) | B-2 (1.60) | 0.10 |
| Example 3 | D-1 (0.20) | A-3 (0.30) | B-3 (1.55) | 0.20 |
| Example 4 | D-1 (0.20) | A-4 (0.25) | B-4 (1.50) | 0.25 |
| Example 5 | D-8 (0.15) | A-1 (0.30) | B-5 (1.55) | 0.20 |
| Example 6 | D-13 (0.15) | A-1 (0.35) | B-6 (1.75) | 0.15 |
| Example 7 | D-3 (0.20) | A-3 (0.35) | B-7 (1.60) | 0.15 |
| Example 8 | D-6 (0.10) | A-2 (0.15) | B-8 (1.50) | 0.20 |
| Example 9 | D-4 (0.15) | A-1 (0.25) | B-9 (1.60) | 0.20 |
| Example 10 | D-18 (0.10) | A-1 (0.30) | B-10 (1.55) | 0.20 |
| Example 11 | D-1 (0.25) | A-1 (0.30) | B-1 (1.10) | 0.09 |
| Example 12 | D-1 (0.20) | A-2 (0.25) | B-2 (1.90) | 0.15 |
| Comparative Example 1 | none | A-1 (0.35) | B-1 (1.50) | image was not formed |
| Comparative Example 2 | D-1 (0.20) | none | B-1 (1.55) | image was not formed |
| Comparative Example 3 | DR-1 | A-1 (0.35) | B-1 (1.50) | 1.60 |

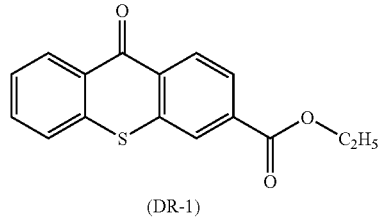

(DR-1)

As apparent from Table 2, in Examples 1 to 12 using the imitation system of the present invention, a sufficiently high sensitivity is exhibited. It is apparent from comparison with Comparative Examples 1 to 3 not using the initiation system of the present invention that high sensitivity can be expressed by the initiation system of the present invention using a fluorescent brightening agent and an activator compound in combination. Furthermore, it can be understood from Examples 1 to 4 that the activator compounds of the present invention over a wide range can be applied irrespective of the sensitization mechanism.

Examples 13 to 17 and Comparative Example 4

Lithographic printing plates were produced through the following procedure and evaluated on the printing performance. The results are shown in Table 3.

[Pretreatment of Support]

The surface of a 0.3 mm-thick aluminum plate formed of a material 1S was grained by using No. 8 nylon brush and water suspension of 800-mesh pumice stone and then thoroughly washed with water. Thereafter, the plate was etched by dipping it in 10 mass % sodium hydroxide at 70° C. for 60 seconds, washed with running water, neutralization-washed with 20 mass % nitric acid and then washed with water. The resulting plate was subjected to electrolytic surface roughening in an aqueous 1 mass % nitric acid solution under the condition of VA=12.7 V by using a sinusoidal alternating waveform current with an anode time electricity of 300 coulomb/dm$^2$. The surface roughness was measured and found to be 0.45 μm (Ra indication according to JIS B0601).

[Hydrophilization Treatment of Support Surface]

The support prepared above was dipped in an aqueous 2.5 mass % No. 3 sodium silicate (SiO$_2$=from 28 to 30%, Na$_2$O=from 9 to 10%, Fe=0.02% or less) solution at a pH of 11.2 and 70° C. for 13 seconds, and then washed with water. The amount of Si element was determined by fluorescent X-ray analysis of the surface and from the obtained value, the amount of silicate on the surface was determined as 10 mg/m$^2$.

[Coating of Interlayer]

A coating solution having the composition (A) shown below was prepared, coated on the support surface after hydrophilization above by using a whirler under the condition of 180 rpm such that the coated amount of phenylphosphonic acid became 20 mg/m$^2$, and then dried at 80° C. for 30 seconds.

(Interlayer Coating Solution A)

| Phenylphosphonic acid | 0.07 to 1.4 g |
|---|---|
| Methanol | 200 g |

[Coating of Photosensitive Layer]

A photosensitive solution having the composition shown below was prepared, coated on the support after coating of the interlayer above by using a whirler such that the coated amount became from 1.0 to 2.0 g/m$^2$, and then dried at 100° C. for 1 minute.

(Photosensitive Solution)

| | |
|---|---|
| Addition-polymerizable compound (compound shown in Table 3) | 1.8 g |
| Polyurethane resin binder (compound shown in Table 3) | 2.0 g |
| Fluorescent brightening agent (compound shown in Table 3) | 0.15 g |
| Activator compound (compound shown in Table 3) | 0.1 g |
| 2-Mercaptobenzoxazole | 0.2 g |
| Pigment dispersion | 2.0 g |
| Composition of pigment dispersion: | |
| Pigment Blue 15:6 | 15 parts by mass |
| Allyl methacrylate/methacrylic acid copolymer (copolymerization molar ratio: 83/17) | 10 parts by mass |
| Cyclohexanone | 15 parts by mass |
| Methoxypropyl acetate | 20 parts by mass |
| Propylene glycol monomethyl ether | 40 parts by mass |
| Thermal polymerization inhibitor (N-nitrosophenylhydroxylamine aluminum salt) | 0.01 g |
| Surfactant (Megafac F-177, produced by Dai-Nippon Ink & Chemicals, Inc.) | 0.02 g |
| Methyl ethyl ketone | 20.0 g |
| Propylene glycol monomethyl ether | 20.0 g |

[Coating of Protective Layer]

An aqueous 3 mass % polyvinyl alcohol (saponification degree: 98 mol %, polymerization degree: 550) solution was coated on the photosensitive layer provided above, to have a dry coated mass of 2 g/m² and dried at 100° C. for 2 minutes.

[Exposure of Lithographic Printing Plate Precursor]

The thus-obtained lithographic printing plate precursor was subjected to solid image exposure or halftone image exposure (175 lines/inch and from 1 to 99% in steps of 1%) by using monochromatic light of 400 nm while adjusting the exposure power to give an exposure energy of 200 μJ/cm² on the plate surface.

[Development/Plate-Making]

A predetermined developer (shown in Table 2) and Finisher FP-2W produced by Fuji Photo Film Co., Ltd. were charged into an automatic developing machine LP-850 manufactured by Fuji Photo Film Co., Ltd., and the exposed plate was developed/processed for plate-making at a developer temperature of 30° C. for a development time of 18 seconds to obtain a lithographic printing plate.

[Press Life Test]

Using a printing press R201 manufactured by Roland Co. and an ink GEOS-G(N) manufactured by Dai-Nippon Ink & Chemicals, Inc., the test was performed. The printed matter of solid image area was observed, and the press life was examined by the number of sheets when the image started thinning. As the number is larger, the press life is better.

[Enforced Press Life Test of Halftone Area]

Using a printing press R201 manufactured by Roland Co. and all ink GEOS-G(N) produced by Dai-Nippon Ink & Chemicals, Inc., the test was performed. At the 5,000th sheet from the initiation of printing, the halftone area was wiped with a printing sponge impregnated with PS Plate Cleaner CL-2 produced by Fuji Photo Film Co., Ltd. to wash the ink on the plate surface. Thereafter, 10,000 sheets were printed and the presence or absence of plate slipping of dots on the printed matter was observed with an eye.

[Scumming Resistance Test]

Using a printer R201 manufactured by Roland Co. and an ink GEOS-G(S) produced by Dai-Nippon Ink & Chemicals, Inc., the test was performed. The printed matter of non-image area (unexposed area) was observed and the scumming resistance was evaluated.

The results of these evaluations are shown in Table 3.

(Addition-Polymerizable Compounds in Table 3)

(M-1)

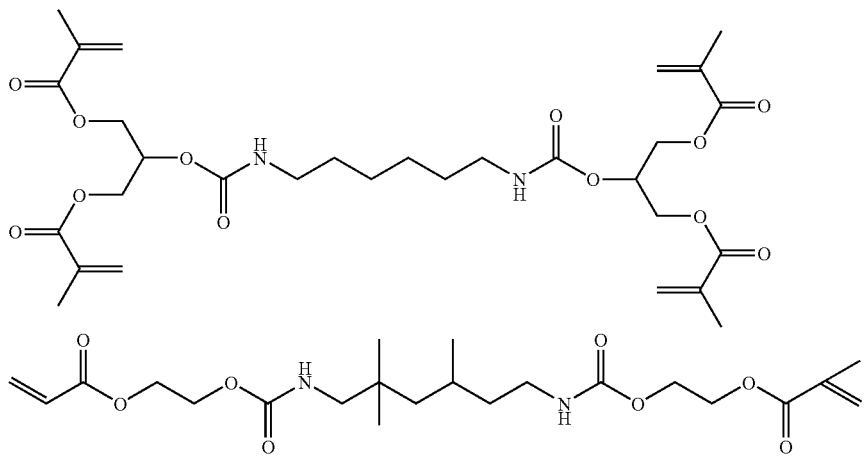

(Developer in Table 3) (DV-1)

An aqueous solution at a pH of 10 having the following composition.

| | |
|---|---|
| Monoethanolamine | 0.1 part by mass |
| Triethanolamine | 1.5 parts by mass |
| Compound of formula 2 below | 4.0 parts by mass |
| Compound of formula 3 below | 2.5 parts by mass |
| Compound of formula 4 below | 0.2 parts by mass |
| Water | 91.7 parts by mass |

(DV-2)

An aqueous solution at a pH of 10 having the following composition.

|  |  |
|---|---|
| Sodium hydrogencarbonate | 1.2 parts by mass |
| Sodium carbonate | 0.8 parts by mass |
| Compound of formula 2 below | 3.0 parts by mass |
| Compound of formula 3 below | 2.0 parts by mass |
| Compound of formula 4 below | 0.2 parts by mass |
| Water | 92.8 parts by mass |

(DV-4)

An aqueous solution at a pH of 12.0 having the following composition.

|  |  |
|---|---|
| Potassium hydroxide | 0.2 g |
| 1K Potassium silicate ($SiO_2/K_2O = 1.9$) | 2.4 g |
| Compound of formula 1 | 5.0 g |
| Ethylenediaminetetraacetic acid.4 Na salt | 0.1 g |
| Water | 91.3 g |

TABLE 3

| | Photosensitive Layer | | | | | Printing Performance | | |
|---|---|---|---|---|---|---|---|---|
| No. | Addition-Polymerizable Compound | Polyurethane Resin Binder | Fluorescent Brightening Agent | Activator Compound | Amount Coated (mg/m$^2$) | Developer Composition | Press Life of Image Area (sheets) | Press Life of Halftone Area | Scumming Resistance of Non-Image Area |
| Example 13 | M-1 | B-4 | D-3 | A-1 | 1.4 | DV-4 | 78,000 | good | good |
| Example 14 | M-2 | B-2 | D-9 | A-1 | 1.4 | DV-1 | 65,000 | good | good |
| Example 15 | M-2 | B-3 | D-15 | A-2 | 1.4 | DV-4 | 95,000 | good | good |
| Example 16 | M-1 | B-1 | D-7 | A-3 | 1.5 | DV-2 | 88,000 | good | good |
| Example 17 | M-2 | B-4 | D-1 | A-1 | 1.4 | DV-4 | 112,000 | good | good |
| Comparative Example 4 | M-1 | BR-1 | D-1 | A-1 | 1.4 | DV-4 | 30,000 | good | good |

As apparent from Table 3, the lithographic printing plate precursor according to the present invention provides an excellent lithographic printing plate even under the condition ensuring plate-making with high productivity by scan exposure, namely, under the exposure condition with very low energy. On the other hand, a practically usable lithographic printing plate was not obtained in Comparative Example 4 where the polyurethane resin binder for use in the present invention was substantially not used.

The structures of the compounds used in Examples and Comparative Examples, other than the fluorescent brightening agent and polyurethane resin binder compound of the present invention, are shown below.

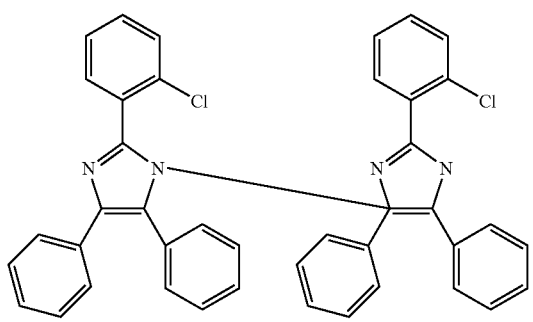
(A-1)

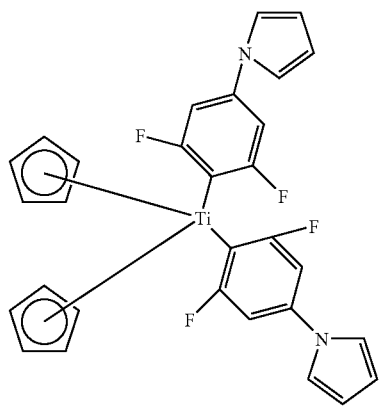
(A-2)

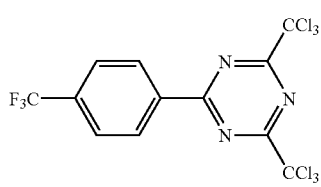
(A-3)

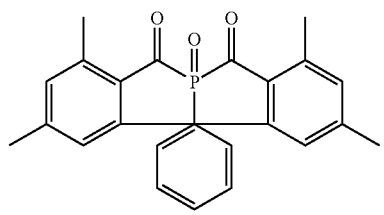
(A-4)

(BR-1)

A copolymer of allyl methacrylate/methacrylic acid/N-isopropylacrylamide (copolymerization molar ratio: 67/13/20)

Actual acid value determined by NaOH titration: 1.55 meq/g, weight average molecular weight determined by GPC: 120,000.

This application is based on Japanese Patent application JP 2004-136036, filed Apr. 30, 2004, the entire content of which is hereby incorporated by reference, the same as if set forth at length.

What is claimed is:

1. A lithographic printing plate precursor comprising a photosensitive layer comprising:

(A) a fluorescent brightening agent which is a compound capable of absorbing light at a wavelength of 350 to 450 nm and emitting the absorbed light energy as fluorescence having a wavelength of 400 to 500 nm, said fluorescent brightening agent having a skeleton of the following structure, with the proviso that the skeleton may have one or more substituents:

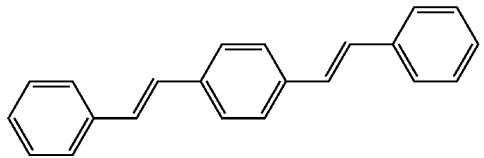

(B) a hexaarylbiimidazole activator compound being capable of inducing a chemical change by an interaction with light absorption of the fluorescent brightening agent to produce at least one of a radical, an acid and a base;

(C) a compound being capable of undergoing a reaction by an effect of at least one of a radical, an acid and a base to irreversibly change in its physical or chemical properties; and (D) a polyurethane resin binder, wherein the polyurethane resin binder is synthesized from at least following compounds (i), (ii), (iii) and (iv):

(i) a diisocyanate compound;
(ii) a diol compound having at least one carboxyl group;
(iii) a diol compound having a logP value of less than 0; and
(iv) a diol compound having a logP value of 0 or more,
with the proviso that each of the diol compound (iii) and the diol compound (iv) does not have a carboxyl group.

2. The lithographic printing plate precursor according to claim 1, wherein the activator compound (B) is a titanocene compound or a hexaarylbiimidazole compound.

3. The lithographic printing plate precursor according to claim 1, wherein the diol compound (iii) has a logP value of from −10 to −0.5.

4. The lithographic printing plate precursor according to claim 1, wherein the diol compound (iii) has a logP value of from −8 to −1.

5. The lithographic printing plate precursor according to claim 1, wherein the diol compound (iv) has a logP value of from 0.5 to 30.

6. The lithographic printing plate precursor according to claim 1, wherein the diol compound (iv) has a logP value of from 1 to 20.

7. The lithographic printing plate precursor according to claim 1, wherein the component (C) is an addition-polymerizable compound having an ethylenically unsaturated double bond.

8. The lithographic printing plate precursor according to claim 1, wherein the polyurethane resin binder (D) has an acid value of from 0.2 to 4.0 meq/g.

9. The lithographic printing plate precursor according to claim 1, wherein the polyurethane resin binder (D) has an acid value of from 0.3 to 3.0 meq/g.

10. The lithographic printing plate precursor according to claim 1, wherein the polyurethane resin binder (D) has a molecular weight in terms of polystyrene as measured by a GPC method of from 5,000 to 500,000.

11. The lithographic printing plate precursor according to claim 1, wherein the diol compound (iii) is represented by formula (A'):

$$\text{HO—(CH}_2\text{CH}_2\text{O)}_n\text{—H} \qquad (A')$$

wherein n represents an integer of 1 or more.

12. The lithographic printing plate precursor according to claim 1, wherein the diol compound (iv) is polypropylene glycol.

13. The lithographic printing plate precursor according to claim 1, wherein the diol compound (iii) is a diol compound represented by formula (A'):

$$\text{HO—(CH}_2\text{CH}_2\text{O)}_n\text{—H} \qquad (A')$$

wherein n represents an integer of 1 or more, and the diol compound (iv) is polypropylene glycol.

14. The lithographic printing plate precursor according to claim 1, wherein the photosensitive layer components are soluble in neutral and/or alkalescent water.

15. The lithographic printing plate precursor according to claim 14, which can perform exposure and development on a printing press.

* * * * *